(12) United States Patent
Saita et al.

(10) Patent No.: US 10,840,025 B2
(45) Date of Patent: Nov. 17, 2020

(54) THIN FILM CAPACITOR HAVING AN OUTER LAYER INCLUDING A SECOND CONDUCTOR LAYER

(71) Applicant: TDK CORPORATION, Tokyo (JP)

(72) Inventors: Hitoshi Saita, Tokyo (JP); Masahiro Yamaki, Tokyo (JP); Yukihiro Azuma, Tokyo (JP); Yoshihiko Yano, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/296,374

(22) Filed: Oct. 18, 2016

(65) Prior Publication Data

US 2017/0110251 A1    Apr. 20, 2017

(30) Foreign Application Priority Data

Oct. 20, 2015   (JP) ................................ 2015-206370

(51) Int. Cl.

| | |
|---|---|
| *H01G 4/33* | (2006.01) |
| *H01G 4/008* | (2006.01) |
| *H01G 4/252* | (2006.01) |
| *H05K 1/16* | (2006.01) |

(Continued)

(52) U.S. Cl.
CPC ............. *H01G 4/33* (2013.01); *H01G 4/008* (2013.01); *H01G 4/012* (2013.01); *H01G 4/252* (2013.01); *H01L 28/60* (2013.01); *H05K 1/162* (2013.01)

(58) Field of Classification Search
CPC .......... H01G 4/33; H01G 4/008; H01G 4/252; H01G 4/012; H05K 1/162; H01L 28/60
See application file for complete search history.

(56) References Cited

U.S. PATENT DOCUMENTS

| | | | | |
|---|---|---|---|---|
| 5,903,431 A | * | 5/1999 | Wilmot | H01G 4/228 |
| | | | | 361/311 |
| 6,023,408 A | * | 2/2000 | Schaper | H01G 4/35 |
| | | | | 361/306.2 |

(Continued)

FOREIGN PATENT DOCUMENTS

| | | |
|---|---|---|
| JP | 2001-185443 A | 7/2001 |
| JP | 2004-014573 A | 1/2004 |

(Continued)

*Primary Examiner* — David M Sinclair
(74) *Attorney, Agent, or Firm* — Oliff PLC

(57) ABSTRACT

In a thin film capacitor, a first electrode layer 1 has one or more regions B in which a distance $H_b$ between a boundary surface I of the first electrode layer 1 and a dielectric layer 2, and a surface of the first electrode layer 1, becomes maximum, and an outer layer 12 has one or more regions T in which a distance $H_t$ between the boundary surface I and a surface of the outer layer 12 becomes maximum, as well as one or more regions t in which the distance $H_t$ between the boundary surface I and the surface of the outer layer 12 does not become maximum. A projected area $S_{Hb}$, a projected area $S_{Ht}$, and a projected area S, satisfy equations (1) and (2):

$$60\% \leq (S_{Hb}/S) \quad (1);$$
$$60\% \leq (S_{Ht}/S) \quad (2).$$

9 Claims, 28 Drawing Sheets

(51) Int. Cl.
*H01L 49/02* (2006.01)
*H01G 4/012* (2006.01)

(56) References Cited

U.S. PATENT DOCUMENTS

| | | | | |
|---|---|---|---|---|
| 7,742,277 | B2* | 6/2010 | Shinoda | H01L 28/65 29/25.42 |
| 8,198,538 | B2* | 6/2012 | Hsu | H01G 4/33 174/251 |
| 9,226,399 | B2* | 12/2015 | Tanaka | H01L 23/49822 |
| 9,859,061 | B2* | 1/2018 | Okada | H01G 5/011 |
| 2002/0141138 | A1* | 10/2002 | Honda | H01G 4/30 361/311 |
| 2003/0223177 | A1 | 12/2003 | Higashi et al. | |
| 2007/0030627 | A1 | 2/2007 | Tsukada | |
| 2007/0187739 | A1* | 8/2007 | Liu | H01G 4/232 257/306 |
| 2008/0024953 | A1* | 1/2008 | Sakamoto | H01G 2/06 361/303 |
| 2008/0106845 | A1* | 5/2008 | Kunimatsu | H01G 4/008 361/303 |
| 2008/0129317 | A1* | 6/2008 | Oba | G06F 3/044 324/663 |
| 2008/0158777 | A1* | 7/2008 | Sohn | H01G 4/232 361/321.1 |
| 2009/0080139 | A1* | 3/2009 | Yu | H01G 4/33 361/301.4 |
| 2009/0168294 | A1* | 7/2009 | Park | H01G 4/30 361/301.4 |
| 2010/0246091 | A1* | 9/2010 | Komuro | H01G 4/228 361/313 |
| 2011/0059593 | A1* | 3/2011 | Xue | H01L 24/03 438/396 |
| 2013/0051126 | A1* | 2/2013 | Kwong | H01G 4/30 365/149 |
| 2013/0329335 | A1* | 12/2013 | Obata | G06F 3/046 361/278 |
| 2013/0342960 | A1 | 12/2013 | Saita et al. | |
| 2014/0239772 | A1* | 8/2014 | Ota | H01C 1/028 310/340 |
| 2015/0294794 | A1* | 10/2015 | Takagi | H01L 23/66 327/105 |
| 2016/0358711 | A1* | 12/2016 | Oguni | H01G 4/1227 |

FOREIGN PATENT DOCUMENTS

| | | |
|---|---|---|
| JP | 2006-100603 A | 4/2006 |
| JP | 2007-042989 A | 2/2007 |
| JP | 2007149730 A * | 6/2007 |
| JP | 2008-218481 A | 9/2008 |
| JP | 2009-238920 A | 10/2009 |
| JP | 2014-007239 A | 1/2014 |

\* cited by examiner

THIN FILM CAPACITOR HAVING AN OUTER LAYER INCLUDING A SECOND CONDUCTOR LAYER

TECHNICAL FIELD

The present invention relates to a thin film capacitor.

BACKGROUND

An allowable mounting space of electronic components in an electronic apparatus tends to decrease with downsizing of the electronic apparatus. A capacitor (also referred to as to a "condenser" in many cases in Japan) is an electronic component to be mounted in many electronic apparatuses, and also needs downsizing and reduction in thickness. A thin film capacitor has a dielectric layer and an insulating film that are thinner than those of a laminated ceramic capacitor formed by a conventional thick film processing, and can be further reduced in height. Thus, the thin film capacitor is expected to be used as an electronic component that is reduced in height and is to be mounted in a small space. In addition, a capacitor embedded in an electronic circuit board also has been developed in recent years (refer to Japanese Unexamined Patent Publication Application No. 2004-14573, Japanese Unexamined Patent Publication Application No. 2006-100603, Japanese Unexamined Patent Publication Application No. 2007-42989, and Japanese Unexamined Patent Publication Application No. 2008-218481).

SUMMARY

A method of embedding a thin film capacitor in an electronic circuit board made of resin includes a method having the steps of mounting a thin film capacitor on a resin board before curing, then sandwiching the thin film capacitor with a resin sheet before curing, and curing the resin by hot press at a temperature from 100° C. to 200° C. to embed the thin film capacitor in the board. Unfortunately, in a press process when the thin film capacitor is embedded, nonuniform stress is sometimes applied to a dielectric layer of the thin film capacitor to cause a crack in the dielectric layer, whereby the thin film capacitor embedded may be deteriorated in humidity load reliability.

The present invention is made in light of the above-mentioned circumstances, and an object thereof is to provide a thin film capacitor having excellent humidity load reliability when embedded in an electronic circuit board.

The present invention is a thin film capacitor that comprises a first electrode layer, an outer layer including a second electrode layer, and a dielectric layer provided between the first electrode layer and the second electrode layer. The first electrode layer has one or more regions B in which a distance between a boundary surface of the first electrode layer and the dielectric layer, and a surface of the first electrode layer, becomes maximum, and the outer layer has one or more regions T in which a distance between the boundary surface and a surface of the outer layer becomes maximum, as well as one or more regions t in which the distance between the boundary surface and the surface of the outer layer does not become maximum. In a case where a projected area of all of the regions B projected on a plane parallel to the boundary surface is designated as $S_{Hb}$, a projected area of all of the regions T projected on a plane parallel to the boundary surface is designated as $S_{Ht}$, and a projected area of the first electrode layer, the outer layer, and the dielectric layer, projected on a plane parallel to the boundary surface is designated as S, the $S_{Hb}$ and the S satisfy an equation (1) below, and the $S_{Ht}$ and the S satisfy an equation (2) below:

$$60\% \leq (S_{Hb}/S) \quad (1);$$

$$60\% \leq (S_{Ht}/S) \quad (2).$$

The thin film capacitor with the structure can be provided with excellent humidity load reliability even when embedded in an electronic circuit board.

In the thin film capacitor, the outer layer has the plurality of regions T, and in a case where each of regions in the one or more regions t, existing between the regions T, is designated as a region $t_{out}$, and a maximum value in maximum widths of the respective regions $t_{out}$ is designated as $L_{tout}$, the $S_{Ht}$ and the $L_{tout}$ can satisfy an equation (3) below:

$$10 \leq (S_{Ht})^{1/2}/L_{tout} \leq 2500 \quad (3).$$

In addition, in a case where each of regions in the one or more regions t, existing in the regions T, is designated as a region $t_{in}$, and a maximum value in maximum diameters of the respective regions $t_{in}$ is designated as $L_{tin}$, the $S_{Ht}$ and the $L_{tin}$ can satisfy an equation (4) below:

$$10 \leq (S_{Ht})^{1/2}/L_{tin} \leq 2500 \quad (4.)$$

The first electrode layer can further has one or more regions b in which a distance between the boundary surface and the surface of the first electrode layer does not become maximum.

In addition, the first electrode layer has the plurality of regions B, and in a case where each of regions in the one or more regions b, existing between the regions B, is designated as a region $b_{out}$, and a maximum value in maximum widths of the respective regions $b_{out}$ is designated as $L_{bout}$, the $S_{Hb}$ and the $L_{bout}$ can satisfy an equation (5) below:

$$10 \leq (S_{Hb})^{1/2}/L_{bout} \leq 2500 \quad (5).$$

In addition, in a case where each of regions in the one or more regions b, existing in the regions B, is designated as a region $b_{in}$, and a maximum value in maximum diameters of the respective regions $b_{in}$ is designated as $L_{bin}$, the $S_{Hb}$ and the $L_{bin}$ can satisfy an equation (6) below:

$$10 \leq (S_{Hb})^{1/2}/L_{bin} \leq 2500 \quad (6).$$

A thin film capacitor satisfying the equations (3) to (6) enables humidity load reliability to be further improved.

In the thin film capacitor, it is preferable that the outer layer further includes another dielectric layer and another electrode layer.

Providing the structure in a thin film capacitor enables a capacity value of the thin film capacitor to be increased.

In the thin film capacitor, in a case where a thermal expansion coefficient of a material constituting a face exposed toward a direction perpendicular to the boundary surface, in the one or more regions B, is designated as $\alpha_{Hb}$, a thermal expansion coefficient of a material constituting a face exposed toward a direction perpendicular to the boundary surface, in the one or more regions T, is designated as $\alpha_{Ht}$, and a thermal expansion coefficient of the dielectric layer is designated as $\alpha_d$, the $\alpha_{Hb}$ and the $\alpha_d$ can satisfy an equation (7), and $\alpha_{Ht}$ and the $\alpha_d$ can satisfy an equation (8):

$$(|\alpha_d - \alpha_{Hb}|/\alpha_d) \leq 50\% \quad (7);$$

$$(|\alpha_d - \alpha_{Ht}|/\alpha_d) \leq 50\% \quad (8).$$

A thin film capacitor satisfying the equations (5) to (6) enables humidity load reliability to be further improved.

In the thin film capacitor, the first electrode layer can be a metal foil.

Providing the structure in a thin film capacitor reduces the thin film capacitor in thickness and allows the thin film capacitor to be embedded easier in an electronic circuit board.

According to the present invention, even in a press process when a thin film capacitor is embedded in an electronic circuit board, nonuniform stress concentration in a dielectric layer can be prevented to enable a dielectric layer to be prevented from having a crack. Thus, a thin film capacitor with excellent humidity load reliability can be provided even when embedded in an electronic circuit board.

DETAILED DESCRIPTION

Figure 1:
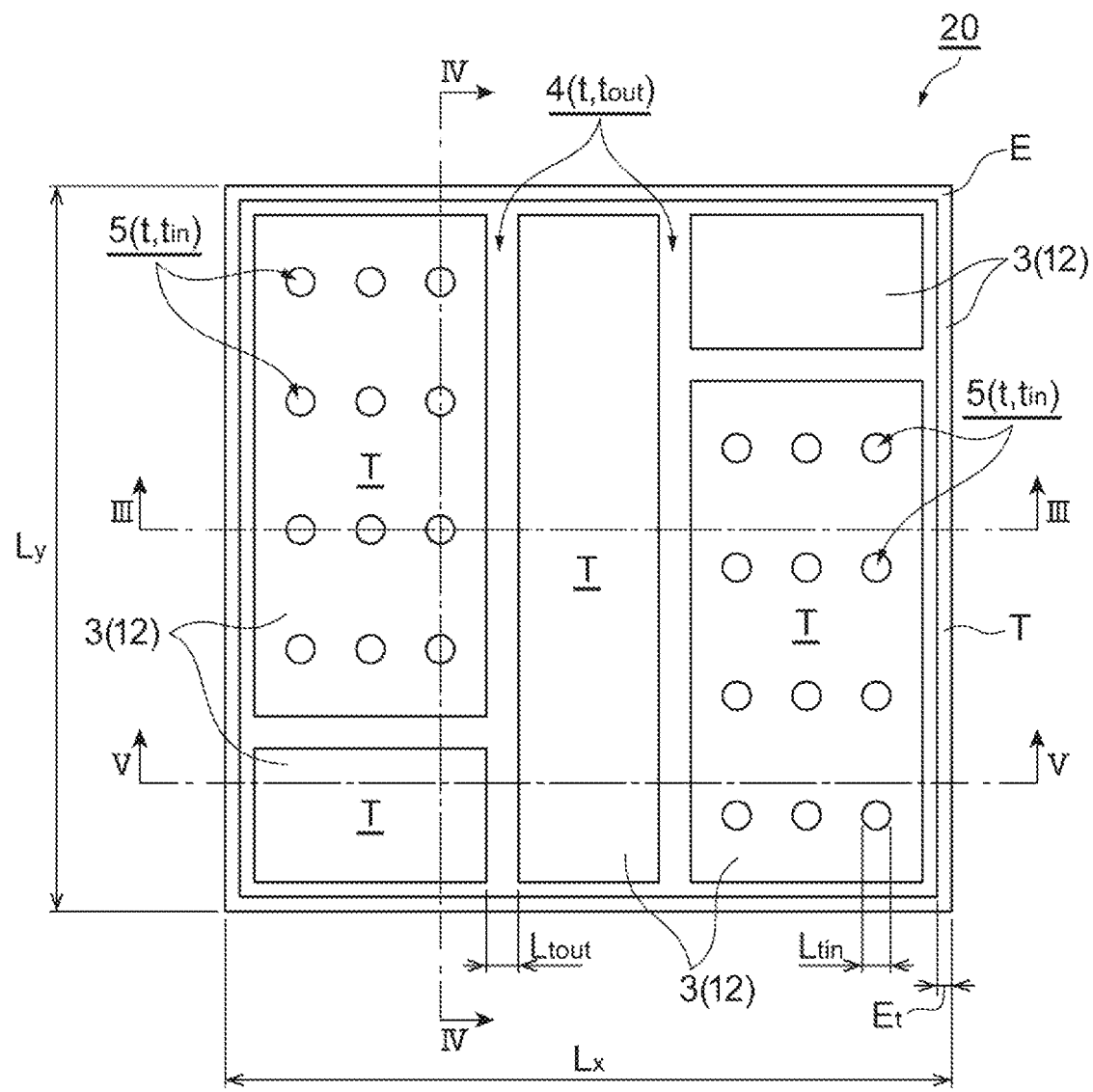
FIG. 1 is a top view of a thin film capacitor according to a first embodiment of the present invention.

Hereinafter, preferred embodiments of the present invention will be described with reference to drawings. The present invention is not limited to the embodiments below, and each of the embodiments below illustrates one of aspects belonging to a technical scope of the present invention. In each of the drawings, an identical or similar element is designated by the same reference numeral so that description on the element is not duplicated.

[Thin Film Capacitor]
(First Embodiment)

Figure 2:
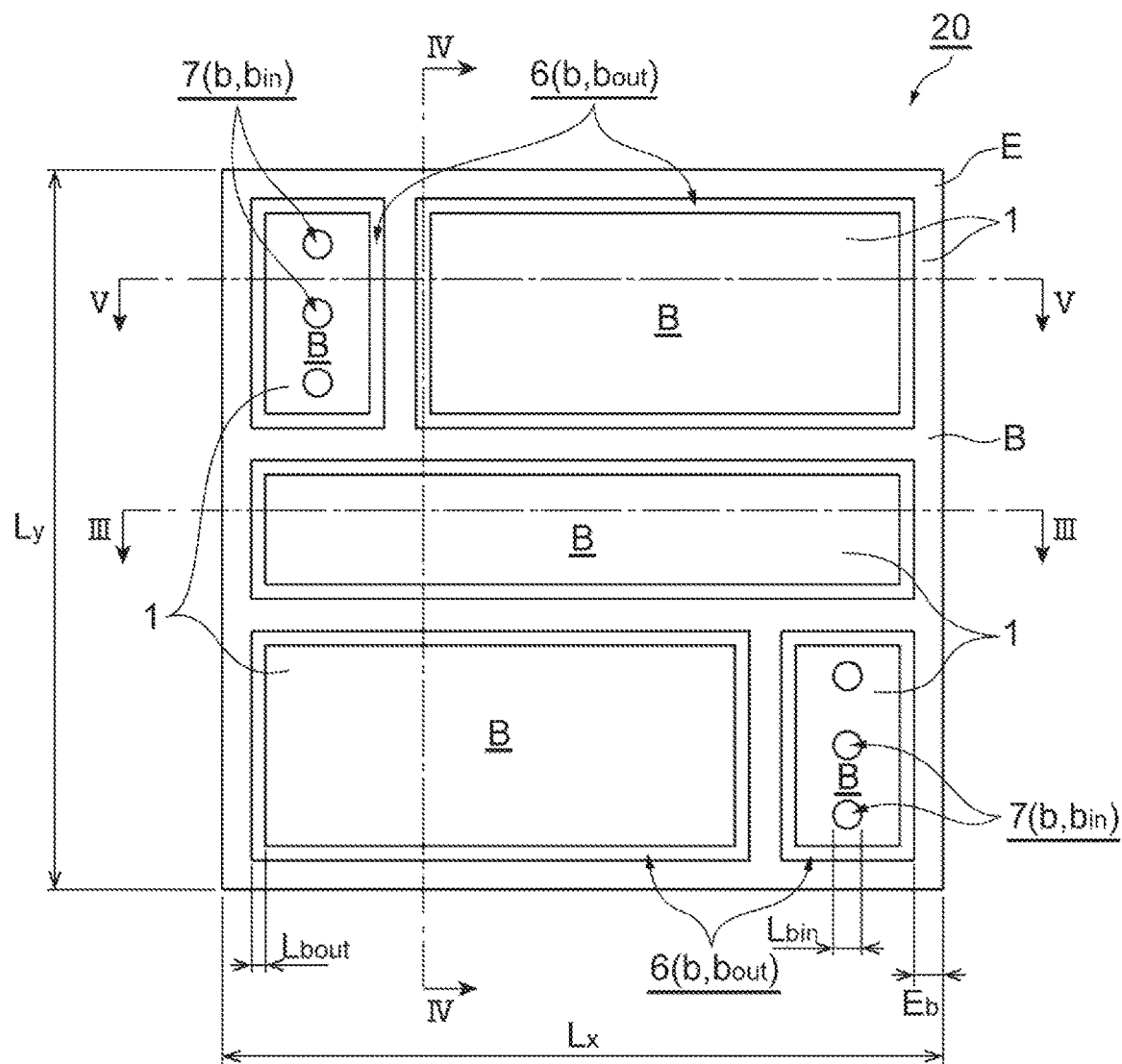
FIG. 2 is a bottom view of the thin film capacitor according to the first embodiment of the present invention.
Figure 3:
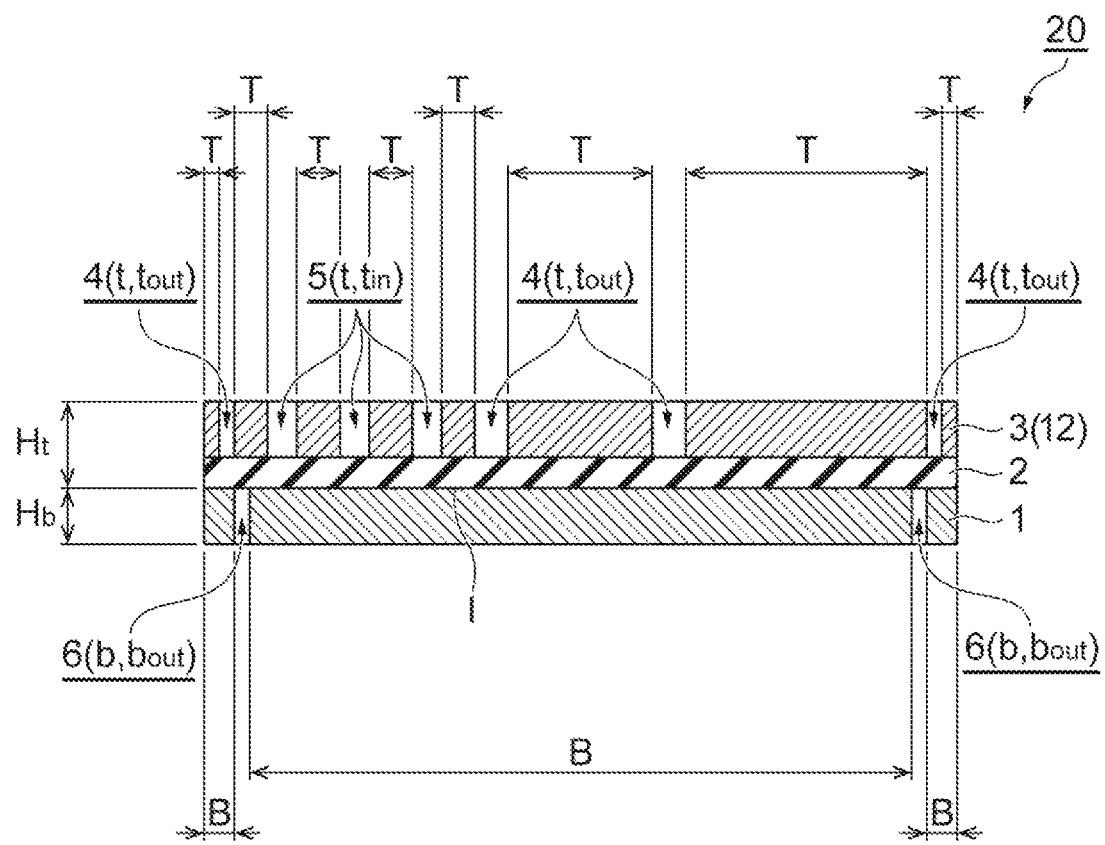
FIG. 3 is a longitudinal sectional view taken along line III-III in each of FIGS. 1 and 2.
Figure 4:
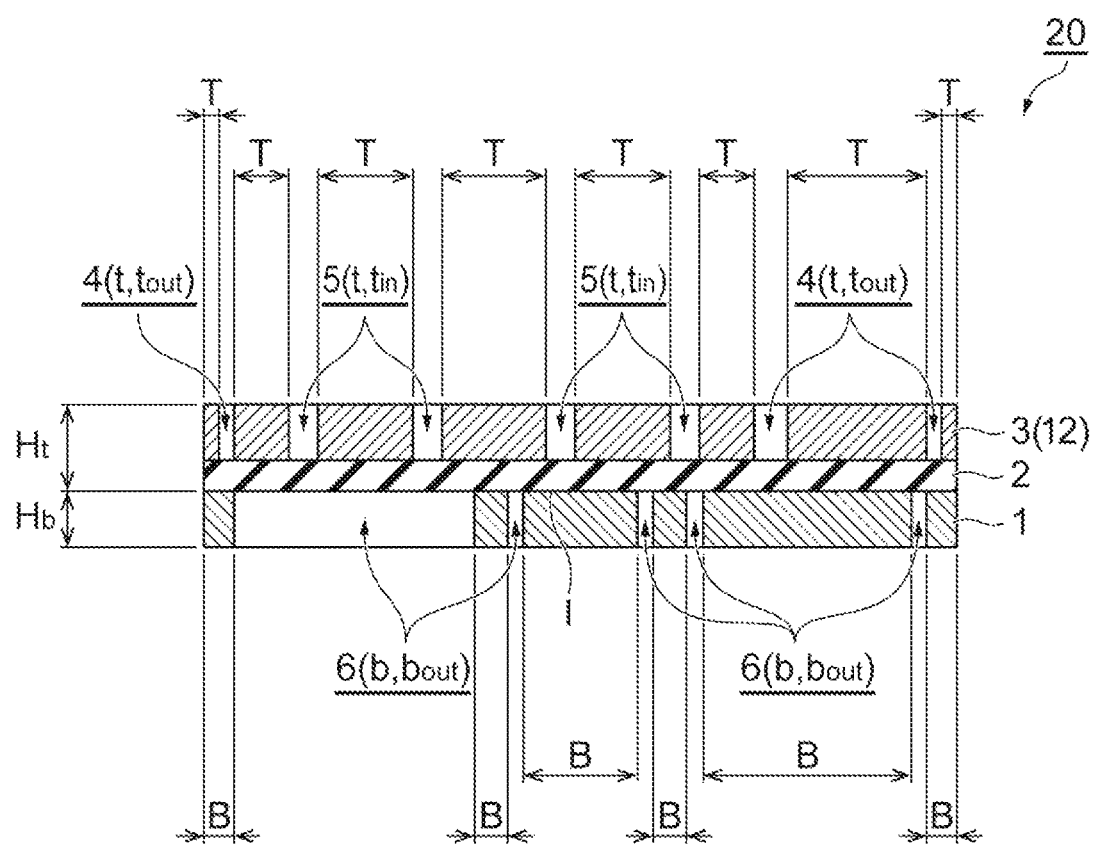
FIG. 4 is a longitudinal sectional view taken along line IV-IV in each of FIGS. 1 and 2.
Figure 5:
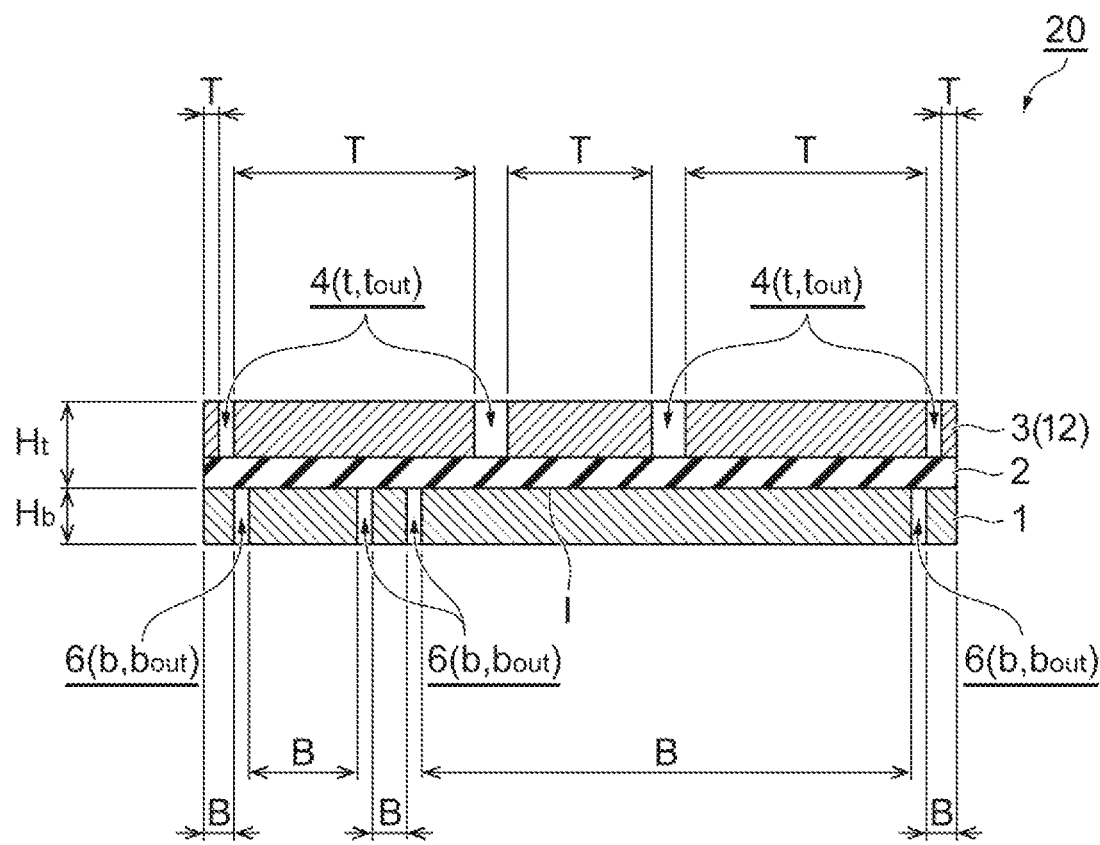
FIG. 5 is a longitudinal sectional view taken along line V-V in each of FIGS. 1 and 2.

FIG. 1 is a top view of a thin film capacitor according to a first embodiment of the present invention, and FIG. 2 is a bottom view of the thin film capacitor according to the first embodiment of the present invention. FIG. 3 is a longitudinal sectional view taken along line III-III in each of FIGS. 1 and 2, FIG. 4 is a longitudinal sectional view taken along line IV-IV in each of FIGS. 1 and 2, and FIG. 5 is a longitudinal sectional view taken along line V-V in each of FIGS. 1 and 2.

In the first embodiment, a thin film capacitor 20 comprises a lower electrode layer (first electrode layer) 1, an outer layer 12 including an upper electrode layer (second electrode layer) 3, and a dielectric layer 2 provided between the lower electrode layer 1 and the upper electrode layer 3. In the present embodiment, the outer layer 12 includes only the upper electrode layer 3.

The lower electrode layer 1 has a plurality of regions B in which a distance $H_b$ between a boundary surface I between the lower electrode layer 1 and the dielectric layer 2, and a surface (a surface exposed outside in a thickness direction) of the lower electrode layer 1, becomes maximum. The lower electrode layer 1 also has regions b each as a recessed portion in which a distance between the boundary surface I and the surface of the lower electrode layer 1 does not become maximum. Specifically, the lower electrode layer 1 has a groove 6 existing between the plurality of regions B as a part of the regions b, and penetrating to the dielectric layer 2. In addition, the lower electrode layer 1 has a through-hole 7 existing in one region B as a part of the regions b, and penetrating to the dielectric layer 2. The lower electrode layer 1 may have only one region B. In addition, the lower electrode layer 1 may have a plurality of regions b, or may have only one region b.

The outer layer 12 (upper electrode layer 3) has a plurality of regions T in which a distance $H_t$ between the boundary surface I between the lower electrode layer 1 and the dielectric layer 2, and a surface (surface exposed outside in a thickness direction) of the outer layer 12 (upper electrode layer 3), becomes maximum. The outer layer 12 also has a plurality of regions t each as a recessed portion in which a distance between the boundary surface I and the surface of the outer layer 12 does not become maximum. Specifically, the outer layer 12 (upper electrode layer 3) has a groove 4 existing between the plurality of regions T as a part of the regions t, and penetrating to the dielectric layer 2. In addition, the outer layer 12 (upper electrode layer 3) has a through-hole 5 existing in one region T as a part of the regions t, and penetrating to the dielectric layer 2. The outer layer 12 may have only one region T, and may have only one region t.

In the thin film capacitor 20 according to the first embodiment, both of the lower electrode layer 1 and the upper electrode layer 3 are patterned so that structure having the regions B and the regions b such as described above, or the regions T and the regions t, is formed. That is, in FIGS. 1, and 3 to 5, the upper electrode layer 3 remaining on the dielectric layer 2 as a pattern constitutes the regions T, and a portion in which no upper electrode layer 3 remains on the dielectric layer 2 constitutes the regions t. In addition, in FIGS. 2 to 5, the lower electrode layer 1 remaining on the dielectric layer 2 as a pattern constitutes the regions B, and a portion in which no lower electrode layer 1 remains on the dielectric layer 2 constitutes the regions b.

In the thin film capacitor 20 according to the first embodiment, equations (1) and (2) below are satisfied.

$$60\% \leq (S_{Hb}/S) \tag{1}$$

$$60\% \leq (S_{Ht}/S) \tag{2}$$

In the equations (1) and (2), S is a projected area of the thin film capacitor 20, namely, the lower electrode layer 1, the outer layer 12 (upper electrode layer 3), and the dielectric layer 2, projected on a plane parallel to the boundary surface I between the lower electrode layer 1 and the dielectric layer 2. In the present embodiment, S can be calculated from the product of a length $L_y$ of a vertical side of the thin film capacitor 20 and a length $L_x$ of a horizontal side thereof in FIGS. 1 and 2. In the equation (1), $S_{Hb}$ is a projected area of all of the regions B projected on a plane parallel to the boundary surface I. In the equation (2), $S_{Ht}$ is a projected area of all of the regions T projected on a plane parallel to the boundary surface I.

A value of "$S_{Hb}/S$"(hereinafter sometimes referred to as an $S_{Hb}/S$ ratio (%)) and a value of "$S_{Ht}/S$"(hereinafter sometimes referred to as an $S_{Ht}/S$ ratio (%)), within the range described above, enable a thickness of the entire thin film capacitor to be uniform. Thus, when a board (e.g. a semiconductor element supporting board) in which the thin film capacitor 20 is embedded is manufactured, stress generated in the thin film capacitor sandwiched between partially-cured resin sheets that is pressed while being heated is uniformly applied to the dielectric layer 2 in an in-plane direction perpendicular to a thickness direction, thereby enabling a crack to be prevented from occurring.

The result of preventing a crack from occurring in the dielectric layer 2 enables excellent humidity load reliability to be acquired as a thin film capacitor embedded board. In addition, not only when the thin film capacitor 20 is embedded in a resin board, but also during manufacturing of the thin film capacitor 20, during manufacturing of an electronic device using the thin film capacitor, and during use of the thin film capacitor, abnormal stress due to temperature change, occurrence of thermal expansion, and the like, can be prevented from being applied to the dielectric layer 2, whereby the thin film capacitor 20 can have excellent characteristics and humidity load reliability even without being embedded in a resin board.

From a similar viewpoint, the $S_{Hb}/S$ ratio (%) in the equation (1) can be 70% or more, 80% or more, and 90% or more. The $S_{Ht}/S$ ratio (%) in the equation (2) can be 70% or more, 80% or more, and 90% or more.

In addition, the $S_{Ht}/S$ ratio (%) can be less than 100%, and thus can be 99.8% or less. The $S_{Hb}/S$ ratio (%) may be 100%, or less than 100%.

In the thin film capacitor 20 according to the first embodiment, the outer layer 12 has a plurality of regions T as illustrated in FIG. 1. In a case where each of regions (groove 4) in a plurality of regions t, existing between the regions T, is designated as a region $t_{out}$, and a maximum value in maximum widths of the respective regions $t_{out}$ is designated as $L_{tout}$, it is preferable that the $S_{Ht}$ and the $L_{tout}$ satisfy an equation (3) below. While having only one coupled region $t_{out}$ in the present embodiment, the upper electrode layer 3 may has a plurality of isolated regions $t_{out}$.

$$10 \leq (S_{Ht})^{1/2}/L_{tout} \leq 2500 \tag{3}$$

In a case where each of regions (through-holes 5) in a plurality of regions t, existing in the regions T, is designated as a region $t_{in}$, and a maximum value in maximum diameters of the respective regions $t_{in}$, is designated as $L_{tin}$, it is preferable that the $S_{Ht}$ and the $L_{tin}$ satisfy an equation (4) below.

$$10 \leq (S_{Ht})^{1/2}/L_{tin} \leq 2500 \tag{4}$$

In FIGS. 1, and 3 to 5, the groove 4 corresponds to the region $t_{out}$, and the through-hole 5 corresponds to the region $t_{in}$. The groove 4 (region $t_{out}$) is provided across each of the regions T, and the through-hole 5 (region $t_{in}$) is provided in any of the regions T.

Width (a distance between the regions T) of the region $t_{out}$ (groove 4) is the shortest distance between respective points in an outer periphery of one of the regions T adjacent to each other across the region $t_{out}$, and a point in an outer periphery of the other region T, the width being defined for each of the points in the outer periphery of the respective regions T. A maximum width of the region $t_{out}$ (groove 4) is longest in the widths, and $L_{tout}$ is a maximum value in maximum widths of the respective regions $t_{out}$.

A maximum diameter of the region $t_{in}$ (through-hole 5) is defined for each of the respective regions $t_{in}$ (through-hole 5).

The "$(S_{Ht})^{1/2}/L_{tout}$"or the "$(S_{Ht})^{1/2}/L_{tin}$"being 2500 or less facilitates control for forming a line and a space of an edge portion of each of the regions T, and enables reduction in an etching defect, whereby a pattern defect of the thin film capacitor 20 tends to decrease. As a result, there is reduced migration of metal ions between the lower electrode layer 1 and the upper electrode layer 3 in the thin film capacitor 20 under a humid environment, and thus humidity load reliability of the thin film capacitor 20 tends to increase. The "$(S_{Ht})^{1/2}/L_{tout}$"or the "$(S_{Ht})^{1/2}/L_{tin}$"being 10 or more enables thickness of the entire thin film capacitor 20 to be more uniform, and thus the humidity load reliability of the thin film capacitor 20 tends to increase. Accordingly, it is preferable to satisfy $10 \leq (S_{Ht})^{1/2}/L_{tout} \leq 2500$, and $10 \leq (S_{Ht})^{1/2}/L_{tin} \leq 2500$.

An upper limit value of "$(S_{Ht})^{1/2}/L_{tout}$"may be 1000 or may be 100. An upper limit value of "$(S_{Ht})^{1/2}/L_{tin}$"may be 1000 or may be 100.

In addition, a lower limit value of "$(S_{Ht})^{1/2}/L_{tout}$"may be 20, or may be 30 or 40. A lower limit value of "$(S_{Ht})^{1/2}/H_{tin}$"may be 20, or may be 30 or 40.

In the thin film capacitor 20 according to the first embodiment, the lower electrode layer 1 has a plurality of regions B as illustrated in FIG. 2. In a case where each of regions (groove 6) in a plurality of regions b, existing between the regions B, is designated as a region $b_{out}$, and a maximum value in maximum widths of the respective regions $b_{out}$ is designated as $L_{bout}$, it is preferable that the $S_{Hb}$ and the $L_{bout}$ satisfy an equation (5) below. While having only one coupled region $b_{out}$ in the present embodiment, the lower electrode layer 1 may has a plurality of isolated regions $b_{out}$.

$$10 \leq (S_{Hb})^{1/2}/L_{bout} \leq 2500 \tag{5}$$

In addition, in a case where each of regions (through-holes 7) in a plurality of regions b, existing in the regions B, is designated as a region $b_{in}$, and a maximum value in maximum diameters of the respective regions $b_{in}$ is designated as $L_{bin}$, it is preferable that the $S_{Hb}$ and the $L_{bin}$ satisfy an equation (6) below.

$$10 \leq (S_{Hb})^{1/2}/L_{bin} \leq 2500 \tag{6}$$

In FIGS. 2 to 5, the groove 6 corresponds to the region $b_{out}$, and the through-hole 7 corresponds to the region $b_{in}$. The groove 6 (region $b_{out}$) is provided across each of the regions B, and the through-hole 7 (region $b_{in}$) is provided in any of the regions B.

Width (a distance between the regions B) of the region $b_{out}$ (groove 6) is the shortest distance between respective points in an outer periphery of one of the regions B adjacent to each other across the region $b_{out}$, and a point in an outer periphery of the other region B, the width being defined for each of the points in the outer periphery of the region B. A maximum width of the region $b_{out}$ (groove 6) is longest in the widths, and $L_{bout}$ is a maximum value in maximum widths of the respective regions $b_{out}$.

A maximum diameter of the region $b_{in}$ (through-hole 7) is defined for each of the regions $b_{in}$ (through-hole 7).

The "$(S_{Hb})^{1/2}/L_{bout}$" or the "$(S_{Hb})^{1/2}/L_{bin}$" being 2500 or less facilitates control for forming a line and a space of an edge portion of each of the regions B, and enables reduction in an etching defect, whereby a pattern defect of the thin film capacitor 20 tends to decrease. As a result, there is reduced migration of metal ions between the lower electrode layer 1 and the upper electrode layer 3 in the thin film capacitor 20 under a humid environment, and thus humidity load reliability of the thin film capacitor 20 tends to increase. The "$(S_{Hb})^{1/2}/L_{bout}$" or the "$(S_{Hb})^{1/2}/L_{bin}$" being 10 or more enables thickness of the entire thin film capacitor 20 to be more uniform, and thus the humidity load reliability of the thin film capacitor 20 tends to increase.

An upper limit value of "$(S_{Hb})^{1/2}/L_{bout}$" may be 1000 or may be 100. An upper limit value of "$(S_{Hb})^{1/2}/L_{bin}$" may be 1000 or may be 100.

In addition, a lower limit value of "$(S_{Hb})^{1/2}/L_{bout}$" may be 20, or may be 30 or 40. A lower limit value of "$(S_{Hb})^{1/2}/L_{bin}$" may be 20, or may be 30 or 40.

In the present embodiment, one of the regions B of the lower electrode layer 1 is an edge portion E in the shape of a frame that surrounds the other regions B across the groove 6 as illustrated in FIG. 2. Width $E_b$ of the edge portion E is the shortest distance between respective points in an outer periphery of the edge portion E and respective points in an outer periphery of the groove 6, and is defined for each of the points in the outer periphery of the edge portion E. The width $E_b$ is from 1 to 20 mm, for example. In addition, one of the regions T of the upper electrode layer 3 is an edge portion E in the shape of a frame that surrounds the other regions T across the groove 4 as illustrated in FIG. 1. A width $E_t$ of the edge portion E is the shortest distance between respective points in an outer periphery of the edge portion E and respective points in an outer periphery of the groove 4, and is defined for each of the points in the outer periphery of the edge portion E. The width $E_t$ is from 1 to 20 mm, for example. Since the regions B and the regions T include the edge portion E in the range described above, abnormal stress tends not to be easily applied to the dielectric layer 2 during manufacturing of the thin film capacitor 20 and during manufacturing of an electronic device using the thin film capacitor 20.

In the thin film capacitor 20 of the present embodiment, it is preferable to satisfy equations (7) and (8) below.

$$(|\alpha_d - \alpha_{Hb}|/\alpha_d) \leq 50\% \tag{7}$$

$$(|\alpha_d - \alpha_{Ht}|/\alpha_d) \leq 50\% \tag{8}$$

In the equations (7) and (8), $\alpha_d$ designates a thermal expansion coefficient of the dielectric layer 2. In the equation (7), $\alpha_{Hb}$ designates a thermal expansion coefficient of a material constituting a face exposed toward a direction perpendicular to the boundary surface I in the plurality of regions B. In the equation (8), $\alpha_{Ht}$ designates a thermal expansion coefficient of a material constituting a face exposed toward a direction perpendicular to the boundary surface I in the plurality of regions T. Both of a value of "$(|\alpha_d - \alpha_{Hb}|/\alpha_d)$"(hereinafter sometimes referred to as an $\alpha_{Hb}/\alpha_d$ ratio (%)) and a value of "$(|\alpha_d - \alpha_{Ht}|/\alpha_d)$"(hereinafter sometimes referred to as an $\alpha_{Ht}/\alpha_d$ ratio (%)) "being 50% or less, allow humidity load reliability to tend to further increase.

A material of the lower electrode layer 1 is selected from among conductive materials such as metal, metal oxide, and conductive organic materials. While having a function of an electrode of the thin film capacitor 20 in the present embodiment, the lower electrode layer 1 further have a function of a base material. The examples of the lower electrode layer 1 having this kind of function include a metal foil used. The examples of the metal foil include Ni-foil, Cu-foil, Al-foil, and the like. The metal foil may be alloy foil containing at least Ni, and may be alloy foil containing noble metal such as Pt. The metal foil can be easily reduced in thickness, and has a soft property. Accordingly, using a metal foil as the lower electrode layer 1 reduces thickness of the thin film capacitor 20 to be acquired, and thus the thin film capacitor 20 can be easily embedded in a support board of a semi-conductor element to be suitable for an embedded semiconductor device. The lower electrode layer 1 may be patterned to constitute a plurality of electrode layers. In addition, the lower electrode layer 1 may be deposited on a Si board or a ceramic board. It is preferable that the lower electrode layer 1 has a thermal expansion coefficient similar to that of the dielectric layer 2. From this kind of viewpoint, it is preferable that the lower electrode layer 1 is a metal foil.

It is preferable that thickness of the lower electrode layer 1 is from 10 μm to 100 μm, and it is more preferable that thickness thereof is from 10 μm to 50 μm. Thickness of the lower electrode layer 1 being 100 μm or less enables a thin film capacitor to be reduced in thickness, and thus the thin film capacitor 20 becomes suitable for an embedded semi-conductor device. In addition, thickness of the lower electrode layer 1 being 10 μm or more allows the thin film capacitor 20 to tend to have sufficient mechanical strength.

The dielectric layer 2 needs to have high permittivity, and may be formed of an oxide having a perovskite structure expressed by $A_yBO_3$, for example. In the perovskite structure, it is preferable that A contains at least one alkaline-earth metal such as Ba, Sr, Ca, and the like. It is preferable that B contains at least one of Ti, Zr, Sn, Hf, and the like.

Here, y represents a ratio of an A element component and a B element component, and it is preferable that y is not less than 0.95 and not more than 1.05. A ratio y being within the range above allows the dielectric layer 2 to easily have high permittivity. In addition, to the perovskite structure, Mn; Mg; a penta-valent metal such as Nb, Ta, and V; a rare-earth element such as Y, Ho, and Dy; and Al, for example, may be added. Adding these elements to the perovskite structure enables further improvement in insulation resistance and high temperature load reliability of the dielectric layer 2. A method of forming the dielectric layer 2 may be any one of a chemical solution method such as SolGel and Metal Organic Decomposiotn (MOD); a gas phase method such as sputtering and Pulse Laser Deposition (PLD); MOCVD; and an evaporation method. It is preferable that thickness of the dielectric layer 2 between the lower electrode layer 1 and the upper electrode layer 3 is from 100 nm to 1000 nm Thickness of the dielectric layer 2 being 100 nm or more allows sufficient insulation resistance tends to be acquired. Thickness of the dielectric layer 2 being 1000 nm or less allows a sufficient capacity value to tend to be acquired.

For the upper electrode layer 3, a material similar to that of the lower electrode layer 1 is available. A method of forming the upper electrode layer 3 includes the methods of forming the dielectric layer 2 described above, and plating, for example. The upper electrode layer 3 may be a single layer, or may be multiple layers. In a case where the upper electrode layer 3 is multiple layers, the upper electrode layer 3 may be a laminate composed of a Ni-layer and a Cu-layer, for example. It is preferable that thickness of the upper electrode layer 3 is from 0.1 to 20 μm.

(Second Embodiment)

Figure 6:
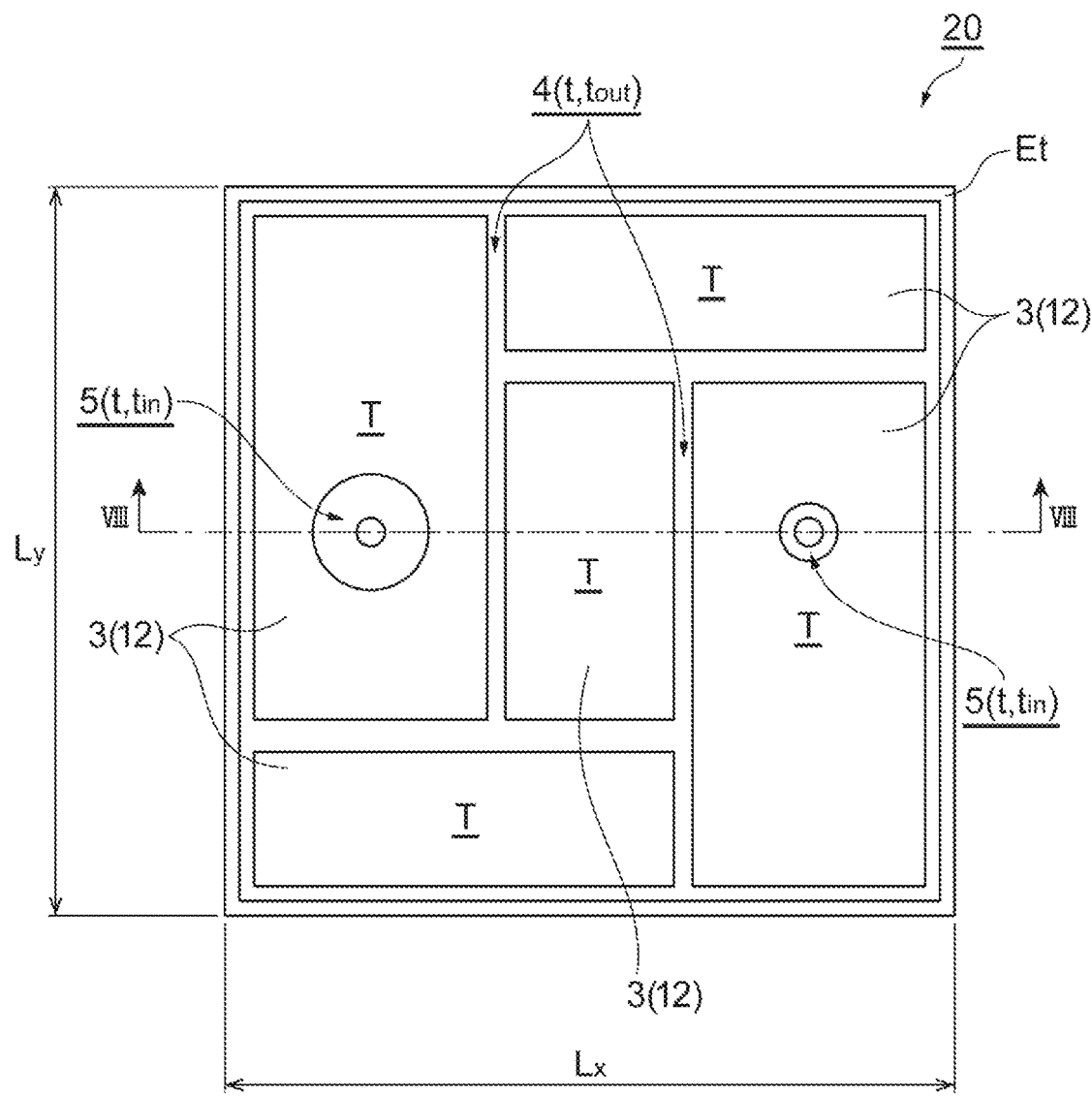
FIG. 6 is a top view of a thin film capacitor according to a second embodiment of the present invention.
Figure 7:
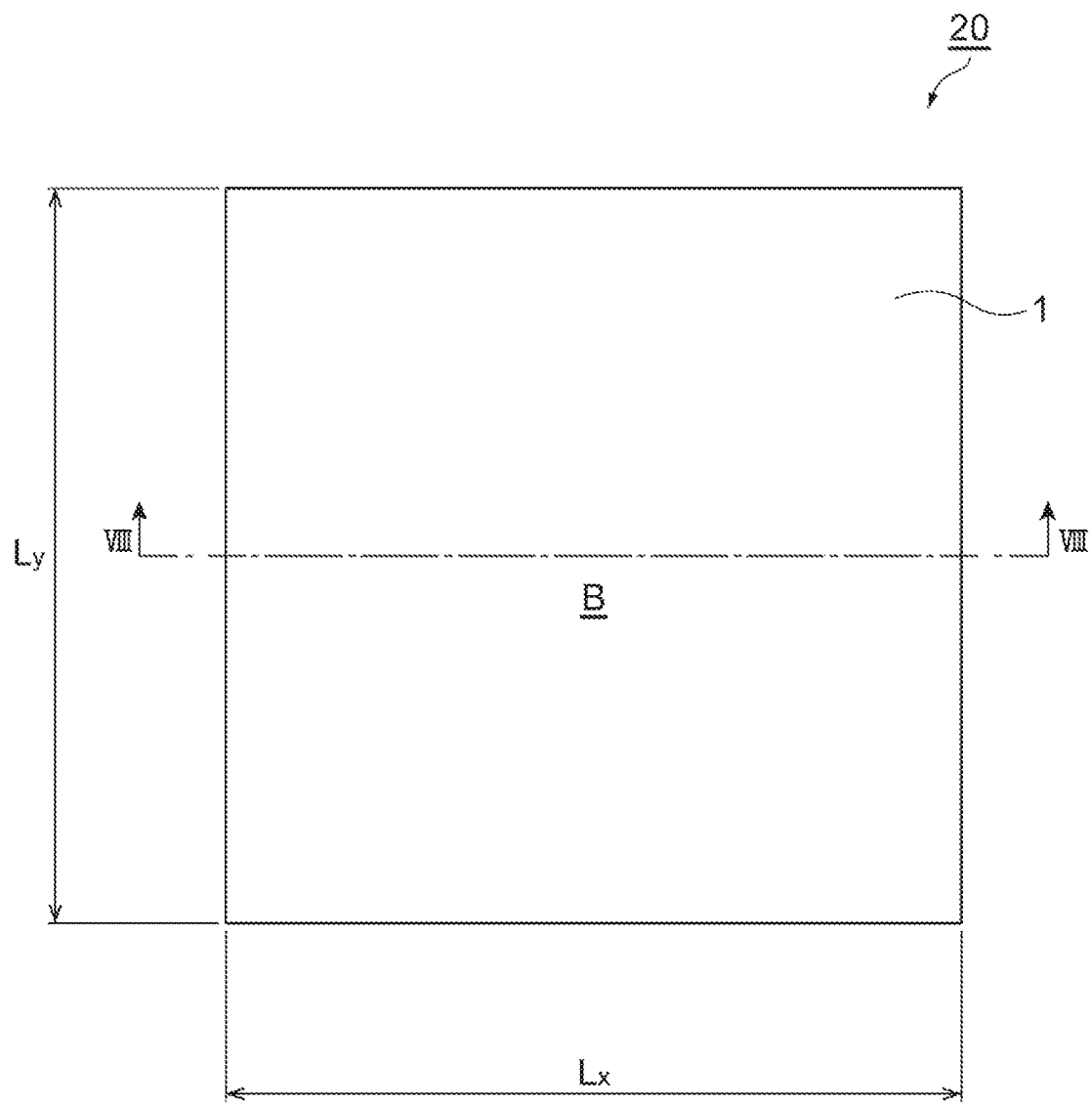
FIG. 7 is a bottom view of the thin film capacitor according to the second embodiment of the present invention.
Figure 8:
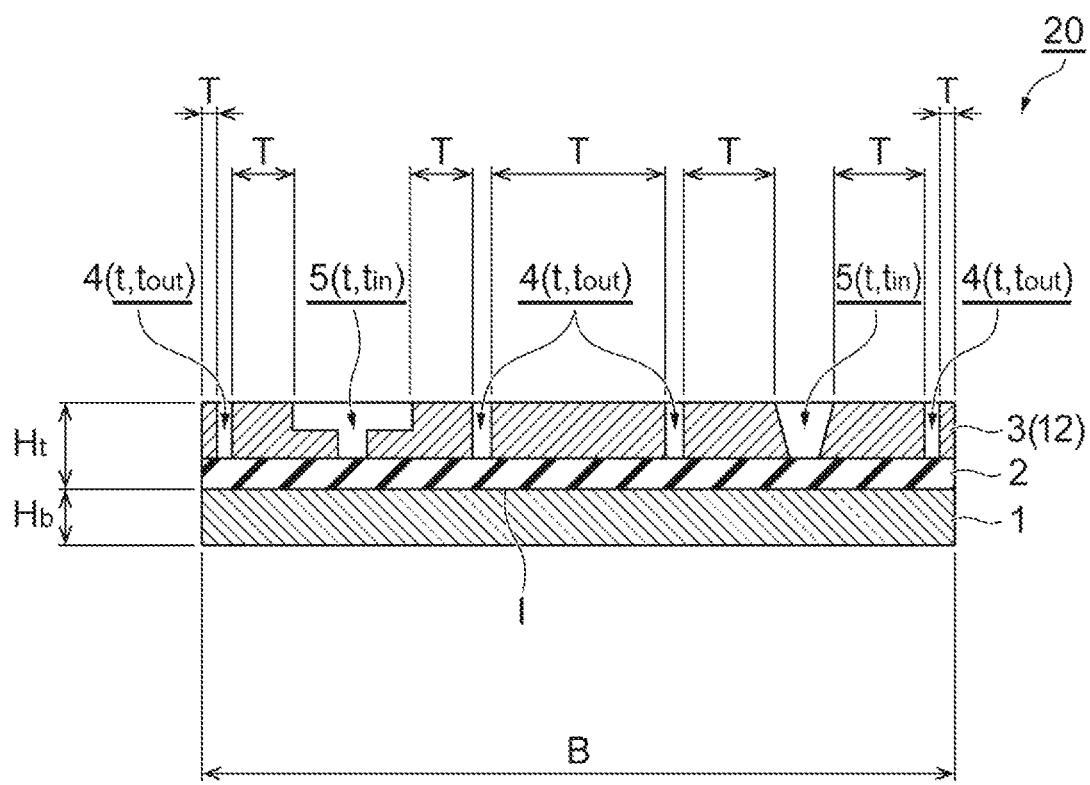
FIG. 8 is a longitudinal sectional view taken along line VIII-VIII in each of FIGS. 6 and 7.

FIG. 6 is a top view of a thin film capacitor according to a second embodiment of the present invention, and FIG. 7 is a bottom view of the thin film capacitor according to the second embodiment of the present invention. FIG. 8 is a longitudinal sectional view taken along line VIII-VIII in each of FIGS. 6 and 7.

The thin film capacitor 20 according to the second embodiment is different from the thin film capacitor according to the first embodiment in that the lower electrode layer 1 is not patterned. Since the lower electrode layer 1 is not patterned in the thin film capacitor 20 of the present embodiment, there is no region b, and thus the S/S ratio is 100%.

In addition, the thin film capacitor 20 according to the second embodiment is different from the thin film capacitor according to the first embodiment in that a part of the through-hole 5 of the upper electrode layer 3 is formed in a stepwise shape or a tapered shape. As described in the first embodiment, the through-hole 5 is the region t in which a distance between the boundary surface I (a boundary surface between the lower electrode layer 1 and the dielectric layer 2) and a surface of the upper electrode layer 3 does not become maximum, and also the region $t_{in}$ because it exists in each of the regions T. When the through-hole 5 is formed in a stepwise shape or a tapered shape as illustrated in FIG. 8, the regions t and $t_{in}$ include not only a region in which the dielectric layer 2 is exposed but also a region such as a step portion and a taper portion in which the dielectric layer 2 is not exposed.

Even in the present embodiment, the outer layer 12 includes only the upper electrode layer 3, and the thin film capacitor 20 satisfies the equations (1) and (2) described above. In addition, it is preferable that the thin film capacitor 20 satisfies the equations (3) to (8) described above.

(Third Embodiment)

Figure 9:
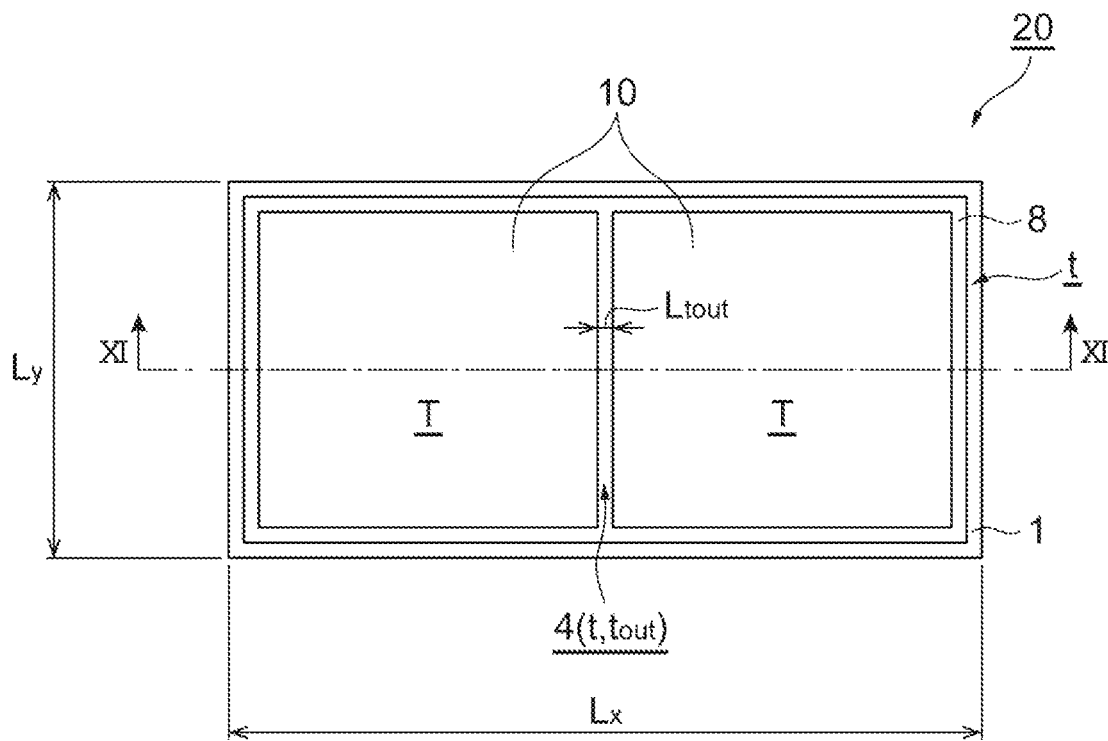
FIG. 9 is a top view of a thin film capacitor according to a third embodiment of the present invention.
Figure 10:
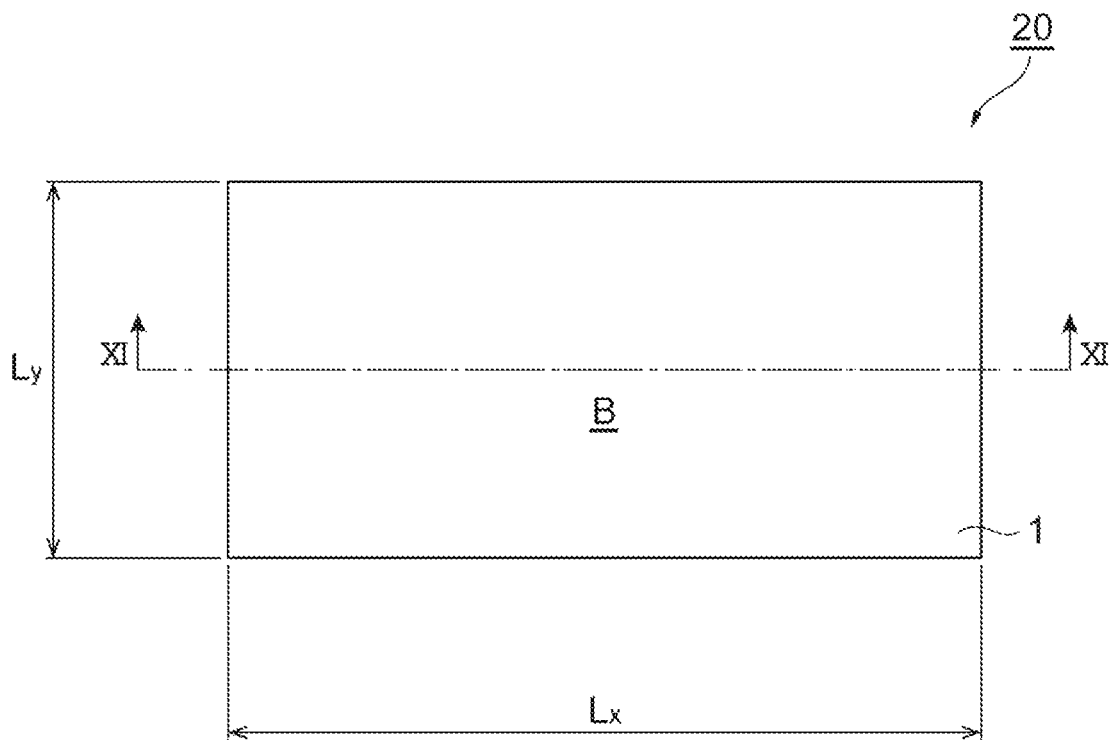
FIG. 10 is a bottom view of the thin film capacitor according to the third embodiment of the present invention.
Figure 11:
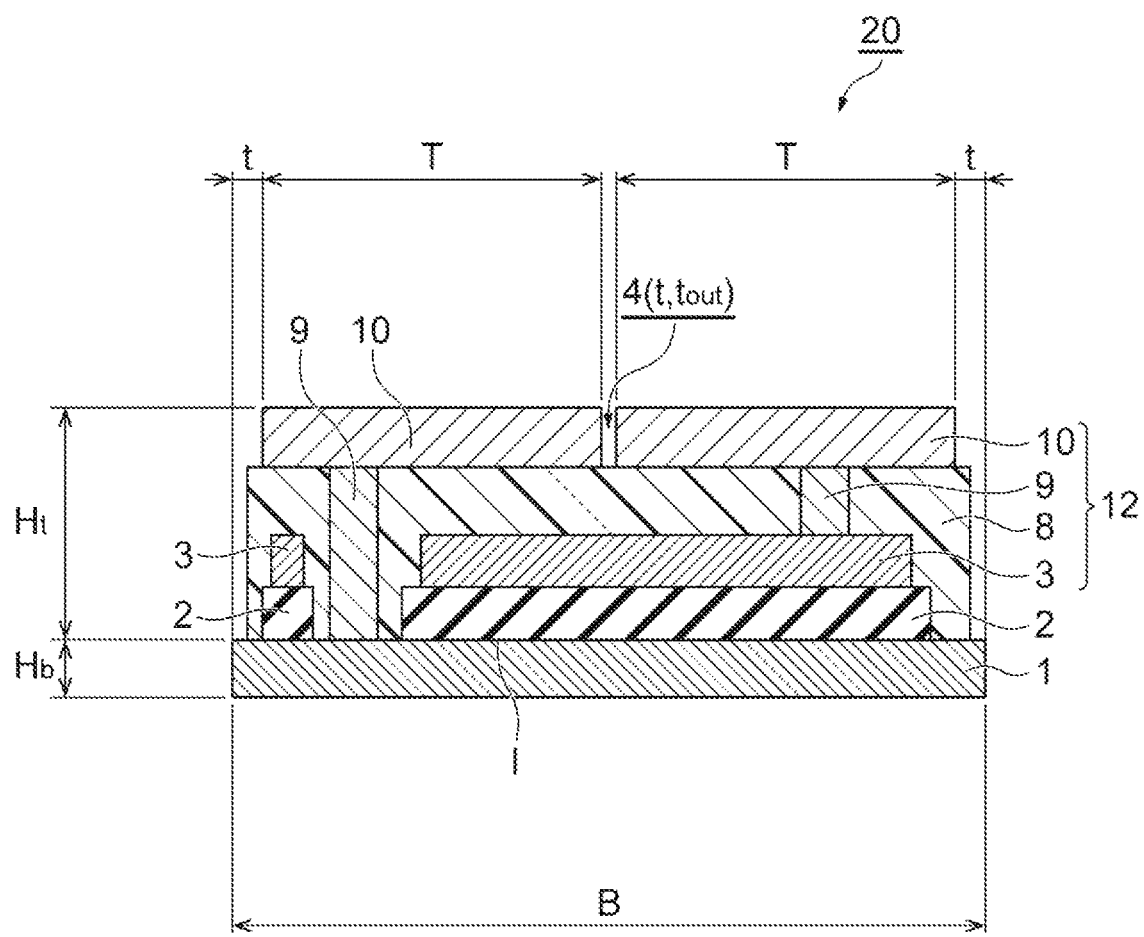
FIG. 11 is a longitudinal sectional view taken along line XI-XI in each of FIGS. 9 and 10.

FIG. 9 is a top view of a thin film capacitor according to a third embodiment of the present invention, and FIG. 10 is a bottom view of the thin film capacitor according to the third embodiment of the present invention. FIG. 11 is a longitudinal sectional view taken along line XI-XI in each of FIGS. 9 and 10.

The thin film capacitor 20 according to the third embodiment is different from the thin film capacitor according to the first embodiment in that the outer layer 12 includes an insulation layer 8, an extracting electrode 9, and a terminal electrode layer 10, other than the upper electrode layer 3. In the thin film capacitor 20 according to the third embodiment, the dielectric layer 2 and the upper electrode layer 3 are covered with the insulation layer 8, and the pair of terminal electrode layers 10 patterned is formed on the insulation layer 8. Each of the pair of terminal electrode layers 10 is electrically connected to the lower electrode layer 1 and the upper electrode layer 3 respectively through the extracting electrode 9.

In the present embodiment, as illustrated in FIG. 11, the region in which the terminal electrode layer 10 is formed is the region T in which a distance $H_t$ to the boundary surface I (boundary surface between the lower electrode layer 1 and the dielectric layer 2) becomes maximum in the outer layer 12. Thus, in FIGS. 9 and 11, a portion where the terminal electrode layer 10 remains on the insulation layer 8 as a pattern constitutes the regions T, and a portion without being covered with the insulation layer 8 as well as a portion where no terminal electrode layer 10 remains on the insulation layer 8 constitutes the regions t. The groove 4 existing between the regions T in the region t is the region $t_{out}$, and the region $t_{out}$ has a maximum value $L_{tout}$ of width. The region B in which a distance $H_b$ to the boundary surface I (boundary surface between the lower electrode layer 1 and the dielectric layer 2) becomes maximum in the lower electrode layer 1 is as with the second embodiment.

As the insulation layer 8, for example, insulating resin such as polyimide-based resin, epoxy-based resin, phenol-based resin, benzocyclobutene-based resin, polyamide-based resin, and fluorine resin, or an inorganic substance such as $SiO_2$, is suitably used. Thickness of the insulation layer 8 from the lower electrode layer 1 is more than a total of a thickness of the dielectric layer 2 and the upper electrode layer 3, and can be set at 100 μm or less, for example.

From a viewpoint of conductivity, it is preferable that the terminal electrode layer 10 is metal. As the metal, Au, Ag, Pt, and Cu are used, for example. From a viewpoint of compatibility of mechanical strength and conductivity, it is preferable that the terminal electrode layer 10 is a metal composed of mainly Cu. The terminal electrode layer 10 may be provided on its surface with a layer composed of Au, Sn, Pd, and the like. A method of forming the terminal electrode layer 10 includes plating. Between the terminal electrode layer 10 and the insulation layer 8, an adhesion layer may be appropriately provided. As the adhesion layer, a metal layer of Cr or Ti is used, for example. It is preferable that thickness of the terminal electrode layer 10 is from 0.1 to 20 μm. The extracting electrode 9 is formed of metal that is the same kind of metal used for the upper electrode layer 3, for example. The extracting electrode 9 can be formed by making a through-hole into the upper electrode layer 3 and the dielectric layer 2 before an insulation layer forming to expose the lower electrode layer 1, forming the insulation layer 8, thereafter making a hole into the insulation layer 8, forming a seed layer by sputtering or the like, and electrolytic plating or the like. It is preferable that the terminal electrode layer 10 has a thermal expansion coefficient similar to that of the dielectric layer 2.

Even in the present embodiment, the thin film capacitor 20 satisfies the equations (1) and (2) described above. In addition, it is preferable that the thin film capacitor 20 satisfies the equations (3) to (8) described above.

(Fourth Embodiment)

Figure 12:
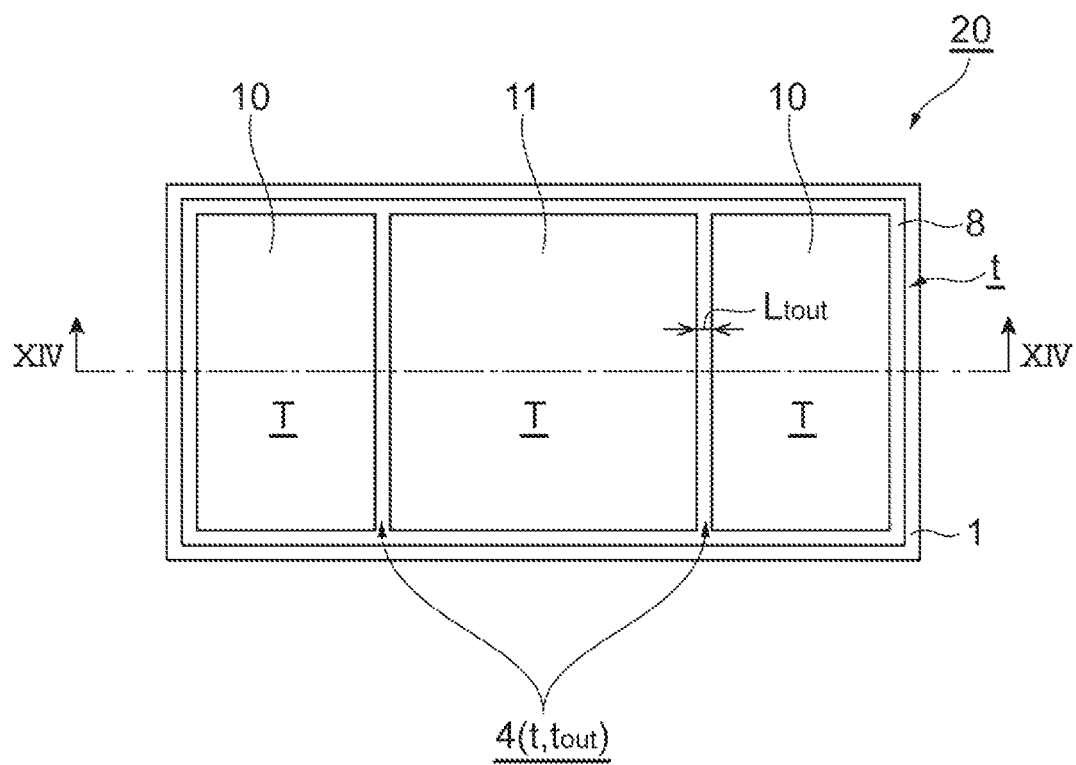
FIG. 12 is a top view of a thin film capacitor according to a fourth embodiment of the present invention.
Figure 13:
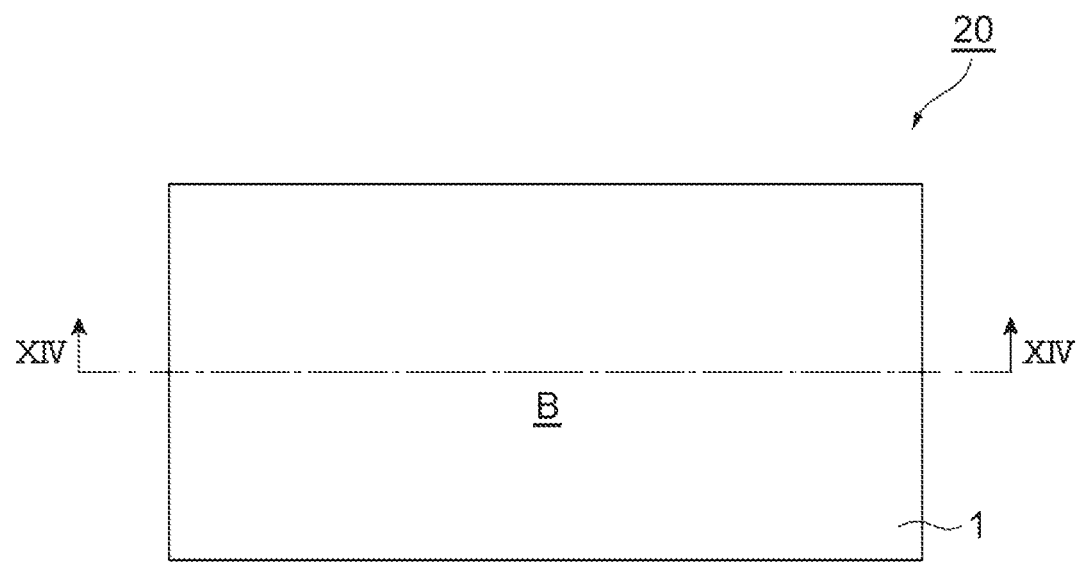
FIG. 13 is a bottom view of the thin film capacitor according to the fourth embodiment of the present invention.
Figure 14:
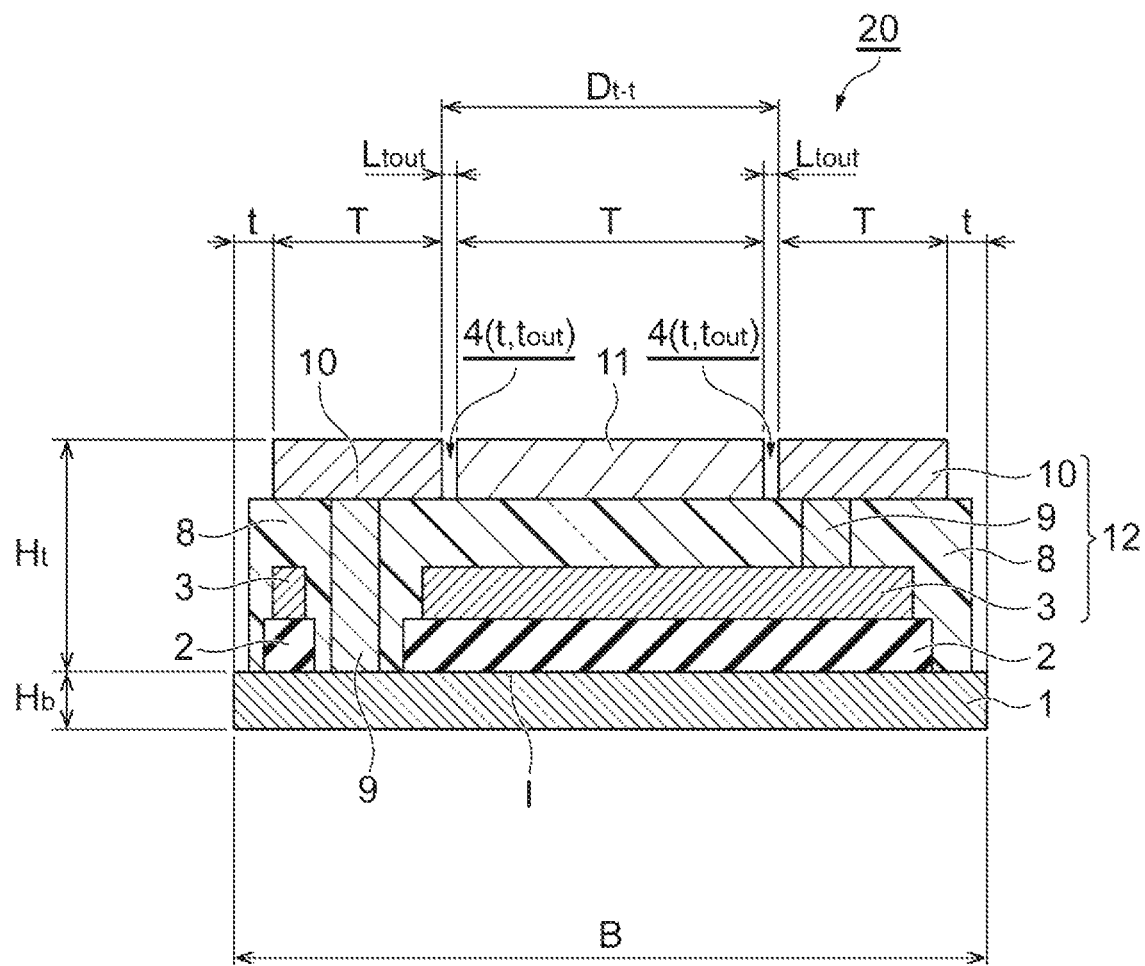
FIG. 14 is a longitudinal sectional view taken along line XIV-XIV in each of FIGS. 12 and 13.

Subsequently, a fourth embodiment will be described with reference to FIGS. 12 to 14. FIG. 12 is a top view of a thin film capacitor according to the fourth embodiment of the present invention, and FIG. 13 is a bottom view of the thin film capacitor according to the fourth embodiment of the present invention. FIG. 14 is a longitudinal sectional view taken along line XIV-XIV in each of FIGS. 12 and 13. The present embodiment is different from the third embodiment in that the outer layer 12 further includes an additional insulation layer 11 between the pair of terminal electrode layers 10, on the insulation layer 8. The additional insulation layer 11 has the same thickness as that of the terminal electrode layer 10, and thus the additional insulation layer 11 constitutes the region T along with the terminal electrode layer 10. The groove 4 existing between the regions T, that is, between the additional insulation layer 11 and the terminal electrode layer 10, in the regions t is the region $t_{out}$, and the region $t_{out}$ has a maximum value $L_{tout}$ of width.

As the additional insulation layer 11, for example, insulating resin such as polyimide-based resin, epoxy-based resin, phenol-based resin, benzocyclobutene-based resin, polyamide-based resin, and fluorine resin, is suitably used.

Even in the present embodiment, the thin film capacitor 20 satisfies the equations (1) and (2) described above. In addition, it is preferable that the thin film capacitor 20 satisfies the equations (3) to (8) described above.

In the equation (8), in a case where a plurality of substances constitutes a surface of the regions T, $\alpha_{Ht}$ may be so-called a weighted average of thermal expansion coefficients using an area ratio that is acquired by adding the product of a thermal expansion coefficient of each of materials constituting the region T and an area ratio of each of the materials, as many the materials. Likewise, even in a case where a plurality of materials constitutes a surface of the region B, $\alpha_{Hb}$ may be a weighted average using an area ratio. Even the case of $\alpha_{Hb}$ can be similarly thought.

(Fifth Embodiment)

Figure 15:
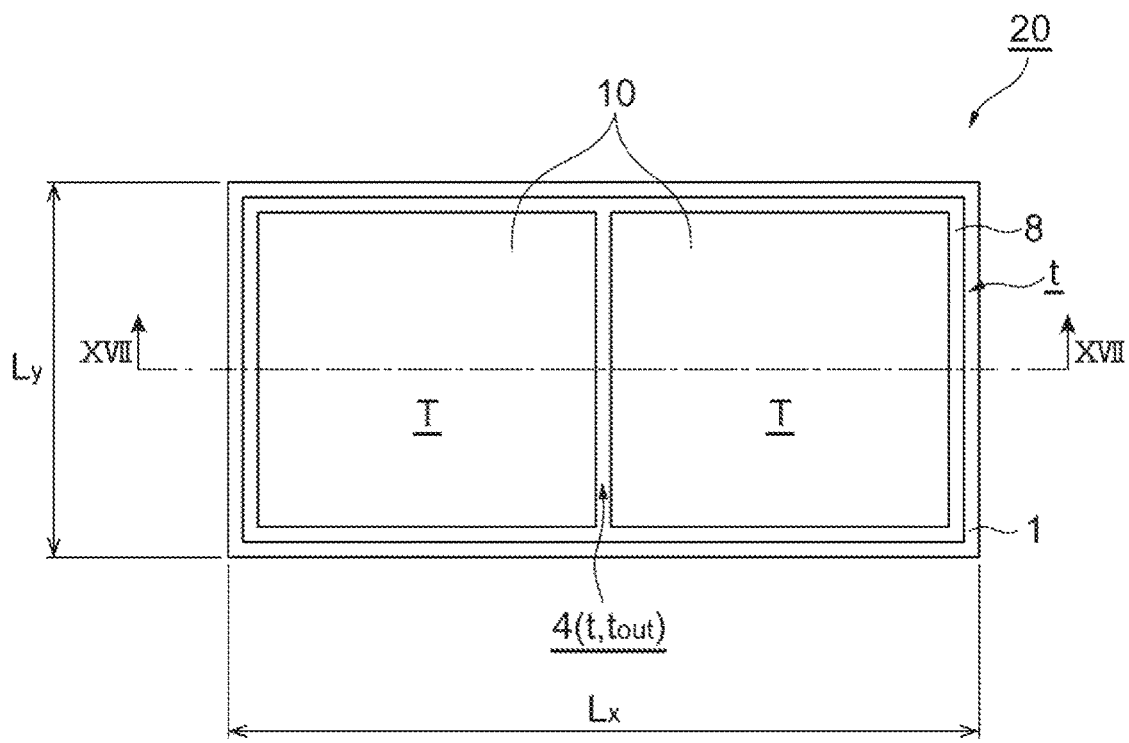
FIG. 15 is a top view of a thin film capacitor according to a fifth embodiment of the present invention.
Figure 16:
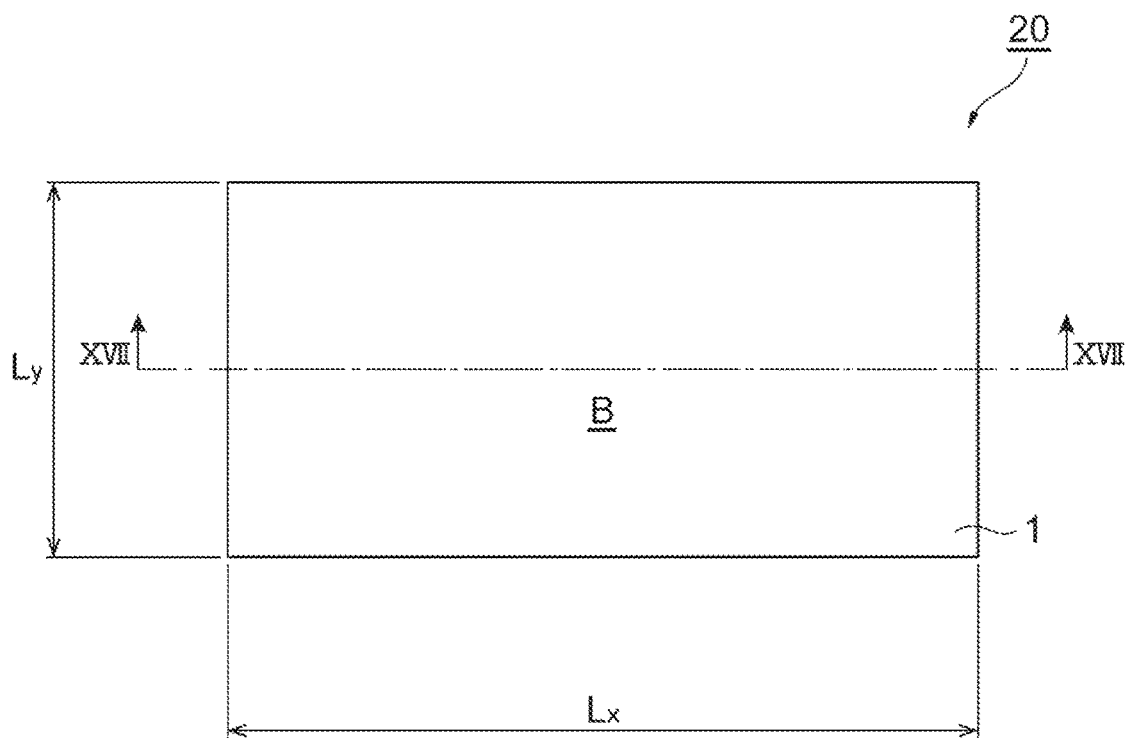
FIG. 16 is a bottom view of the thin film capacitor according to the fifth embodiment of the present invention.
Figure 17:
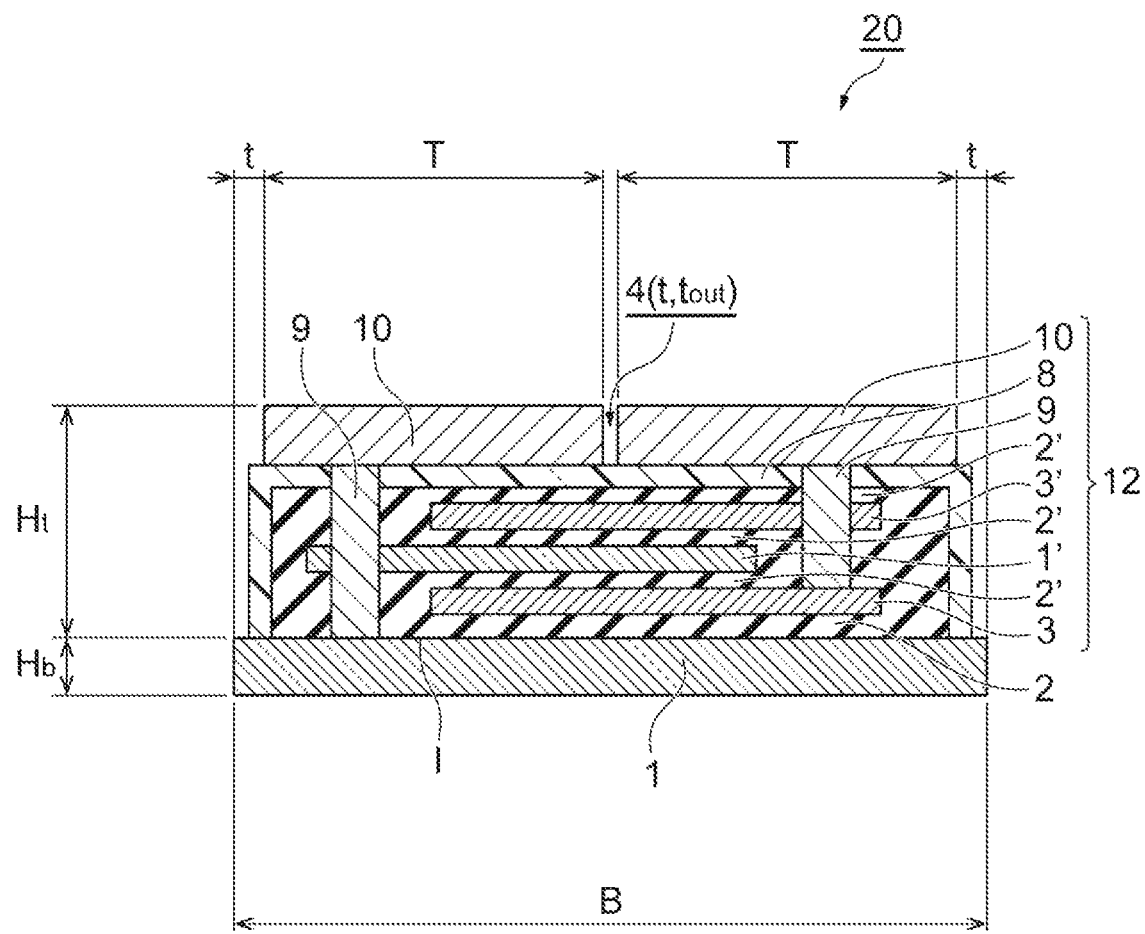
FIG. 17 is a longitudinal sectional view taken along line XVII-XVII in each of FIGS. 15 and 16.

Subsequently, the thin film capacitor 20 according to a fifth embodiment will be described with reference to FIGS. 15 to 17. FIG. 15 is a top view of a thin film capacitor according to the fifth embodiment of the present invention, and FIG. 16 is a bottom view of the thin film capacitor according to the fifth embodiment of the present invention. FIG. 17 is a longitudinal sectional view taken along line XVII-XVII in each of FIGS. 15 and 16.

The thin film capacitor 20 according to the fifth embodiment is different from the thin film capacitor according to the third embodiment in that the outer layer 12 further includes an additional dielectric layer 2', an additional electrode layer 1', and an additional electrode layer 3'. In FIG. 17, the additional dielectric layer 2', the additional electrode layer 1', the additional dielectric layer 2', the additional electrode layer 3', and the additional dielectric layer 2' are laminated on the upper electrode layer 3 in the order described above. The lower electrode layer 1 and the additional electrode layer 1' are electrically connected to each other through the extracting electrode 9, and are also electrically connected to one of the two terminal electrode layers 10. In addition, the upper electrode layer 3 and the additional electrode layer 3' are electrically connected to each other through the other extracting electrode 9, and are also electrically connected to the other of the two terminal electrode layers 10. The dielectric layer 2 and each of the additional dielectric layers 2' surround sides of the upper electrode layer 3, the additional electrode layer 1' and the additional electrode layer 3', and a side face of each of the electrode layers is covered with them.

In the present embodiment, a laminate of the dielectric layer 2, the upper electrode layer 3, the additional dielectric layer 2', the additional electrode layer 1', the additional dielectric layer 2', the additional electrode layer 3', and the additional dielectric layer 2', the laminate being formed on the lower electrode layer 1, is coated with the insulation layer 8, and the terminal electrode layer 10 patterned is further formed on the insulation layer 8. Providing the structure in the thin film capacitor 20 enables a higher capacity value to be acquired.

The region B in which a distance $H_b$ to the boundary surface I (boundary surface between the lower electrode layer 1 and the dielectric layer 2) becomes maximum in the lower electrode layer 1 is as with the third embodiment. The region t, and region T in which a distance $H_b$ to the boundary surface I (boundary surface between the lower electrode layer 1 and the dielectric layer 2) becomes maximum in the outer layer 12 is as with the third embodiment.

Even in the present embodiment, the thin film capacitor 20 satisfies the equations (1) and (2) described above. In addition, it is preferable that the thin film capacitor 20 satisfies the equations (3) to (8) described above.

[Capacitor Device]

Figure 18:
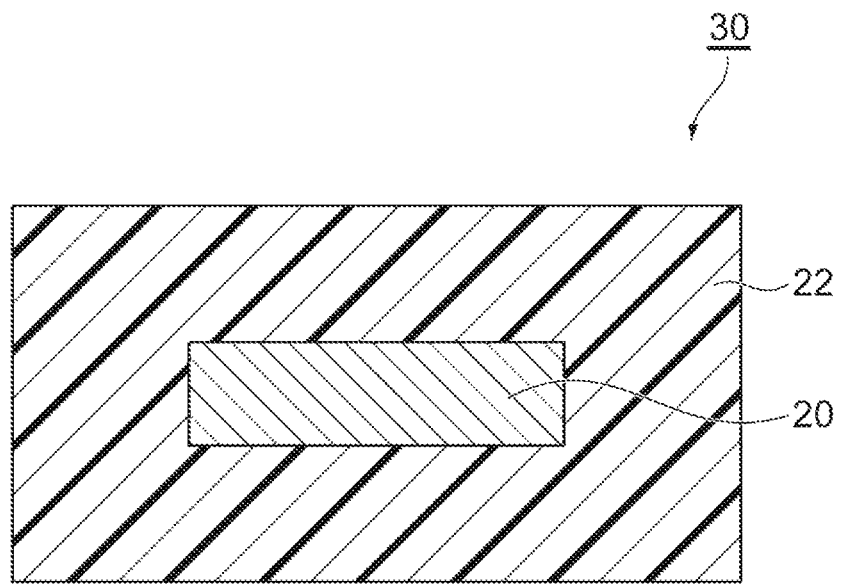
FIG. 18 is a schematic sectional view of a capacitor device acquired by using the thin film capacitor of the present invention.

FIG. 18 is a schematic sectional view of a capacitor device acquired by using the thin film capacitor of the present invention. In FIG. 18, the capacitor device 30 comprises a board 22, and the thin film capacitor 20 embedded in the board 22. The capacitor device 30 is also referred to as a thin film capacitor embedded board. On the capacitor device 30, an active element can be further mounted. The board 22 can be acquired by curing a prepreg containing resin and glass cloth, for example. The prepreg is not particularly limited, and a commercial prepreg is used. The thin film capacitor 20 is disposed between two prepregs, and the thin film capacitor 20 and the two prepregs are heated while being pressurized so that the thin film capacitor 20 is embedded in the board 22 with flow and curing of the resin in the prepreg. It is preferable that thickness of the board 22 is from 100 to 5000 μm, and it is more preferable that thickness thereof is from 500 to 3000 μm.

The capacitor device 30 can include wiring structure (not illustrated) in the board 22 to connect the outside and various kinds of electrodes of the thin film capacitor 20 to each other.

EXAMPLES

While the present invention will be specifically described below using examples, the present invention is not limited to the examples.

[Method of Evaluating Humidity Load Test]

A thin film capacitor acquired in each of examples and comparative examples described later was disposed between two prepregs (a trade name of LAZ-6785GS-J made by Sumitomo Bakelite Co., Ltd), and the prepregs were cured by being pressurized while being heated at 170° C. to embed the thin film capacitor in a board. Subsequently, another prepreg was disposed on each of an upper surface and a lower surface of the board, and they were laminated by using hot press. The board on an upper electrode layer side and a lower electrode layer side of the thin film capacitor is provided with a via formed with a laser, and a Cu seed layer is formed in the via by electroless plating. After that, an extracting electrode is formed in the via and on the via by Cu electrolytic plating, and Au is further formed on a surface of the extracting electrode by sputtering to form a test board. One hundred test boards were formed for each of the examples and the comparative examples. In a case where an electrode is divided into a plurality of electrodes in each of the thin film capacitors, an extracting electrode is formed to apply voltage to an element of each of the electrodes. In each of the examples and the comparative examples, a humidity load test was performed in the manner below.

In a case of Examples 1 to 15, and Comparative Examples 1 to 4

An initial value of an insulation resistance value (Ω) of the thin film capacitor embedded in the test board was measured by using a high resistance meter (a trade name of 4339B made by Agilent Technologies) under conditions of DC 4 V and a room temperature of 25° C. After that, while DC 4 V was applied, a humidity load test was applied to the test board for 2000 hours under high temperature and high humidity environment with a temperature of 85° C. and a humidity of 85% RH. After the test, an insulation resistance value (Ω) of the thin film capacitor in the test board was measured under conditions similar to those described above, and a test board with an insulation resistance value after the test of 1/50 or more of the initial value was determined as a non-defective product. The number of non-defective products in all test boards was used as an evaluation result of the humidity load test. In a case where the number of non-defective products is 80 or more, it is determined that the thin film capacitor has excellent humidity load reliability.

In a case of Examples 16 to 19, and Comparative Examples 5 to 9

An initial value of an insulation resistance value (Ω) of the thin film capacitor embedded in the test board was measured by using the high resistance meter (the trade name of 4339B made by Agilent Technologies) under conditions of DC 4 V and a room temperature of 25° C. After that, while DC 3.3 V was applied, a humidity load test (pressure cooker test) was applied to the test board for 200 hours under high temperature and high humidity environment with a temperature of 130° C. and a humidity of 85% RH. After the test, an insulation resistance value (Ω) of the thin film capacitor in the test board was measured under conditions similar to those described above, and a test board with an insulation resistance value after the test of 1/50 or more of the initial value was determined as a non-defective product. The number of non-defective products in all test boards was used as an evaluation result of the humidity load test. In a case where the number of non-defective products is 80 or more, it is determined that the thin film capacitor has excellent humidity load reliability.

In a case of Examples 20 to 23

An initial value of an insulation resistance value (Ω) of the thin film capacitor embedded in the test board was measured by using the high resistance meter (the trade name of 4339B made by Agilent Technologies) under conditions of DC 4 V and a room temperature of 25° C. After that, while DC 5 V was applied, a humidity load test (pressure cooker test) was applied to the test board for 200 hours under high temperature and high humidity environment with a temperature of 130° C. and a humidity of 85% RH. After the test, an insulation resistance value (Ω) of the thin film capacitor in the test board was measured under conditions similar to those described above, and a test board with an insulation resistance value after the test of 1/50 or more of the initial value was determined as a non-defective product. The number of non-defective products in all test boards was used as an evaluation result of the humidity load test. In a case where the number of non-defective products is 80 or more, it is determined that the thin film capacitor has excellent humidity load reliability.

[Forming of Thin Film Capacitor]

Examples 1 to 9, and Comparative Examples 1 to 3

For a lower electrode layer, Ni-foil of 100 mm×100 mm×30 μm having a polished surface was prepared. A BaTiO$_3$ layer with a thickness of 800 nm was formed on the Ni-foil by sputtering as a dielectric layer. Next, the dielectric layer was crystallized in a reducing atmosphere (an oxygen partial pressure of $10^{-16}$ atm). An Ni-layer with a thickness of 0.5 μm was formed on the dielectric layer by sputtering, and subsequently, a Cu-layer with a thickness of 1 μm was formed by sputtering. In addition, a Cu-layer with a thickness of 16.5 μm was formed on the Cu-layer by electrolytic plating, and an upper electrode layer composed of the Ni-layer and the Cu-layer, formed by sputtering, as well as the Cu-layer formed by plating, was formed on the dielectric layer. After that, the upper electrode layer was patterned by photolithography.

Figure 19:
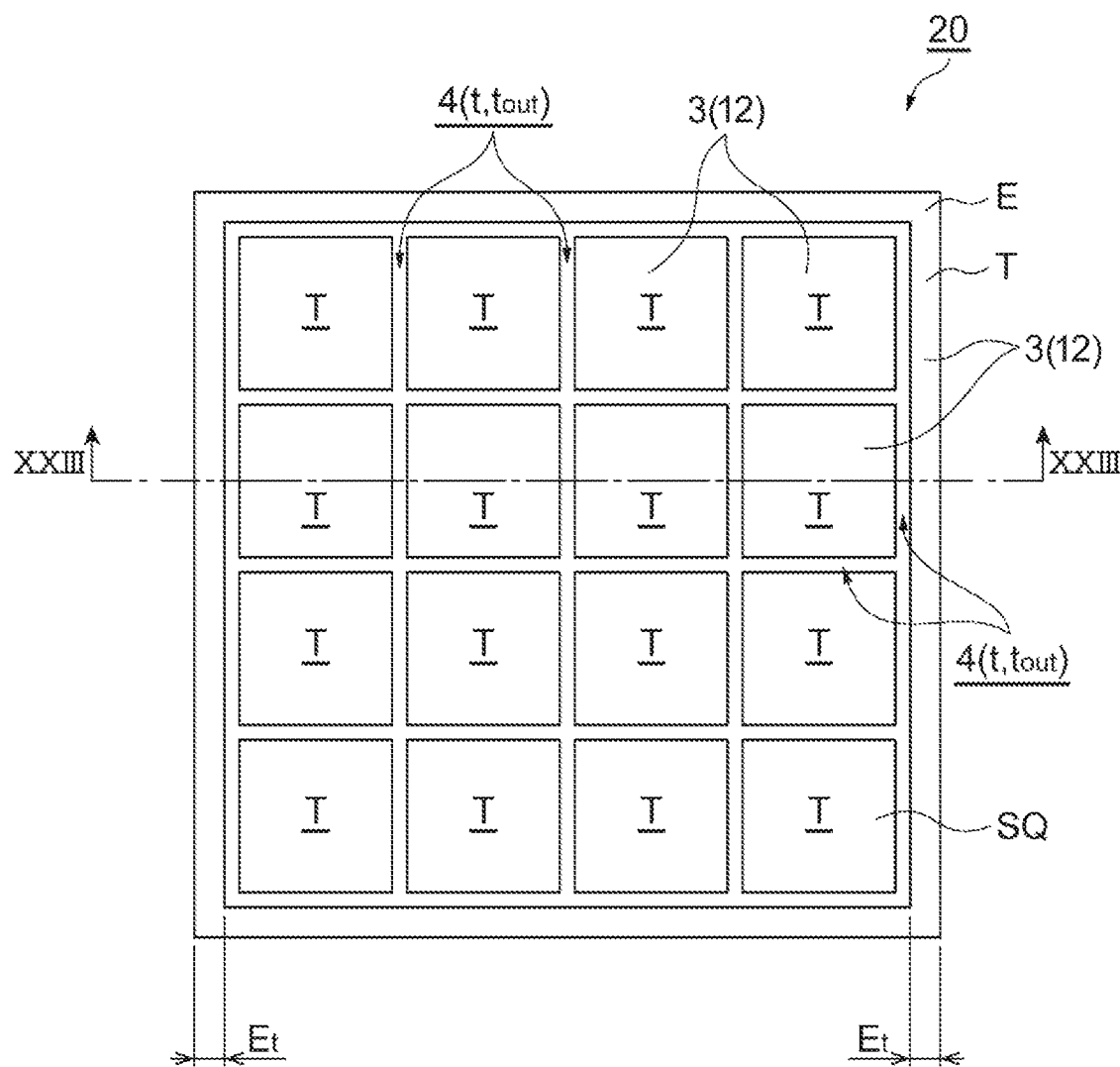
FIG. 19 is a schematic top view of a thin film capacitor formed in each of examples 1 to 6 and in a comparative example 1.
Figure 20:
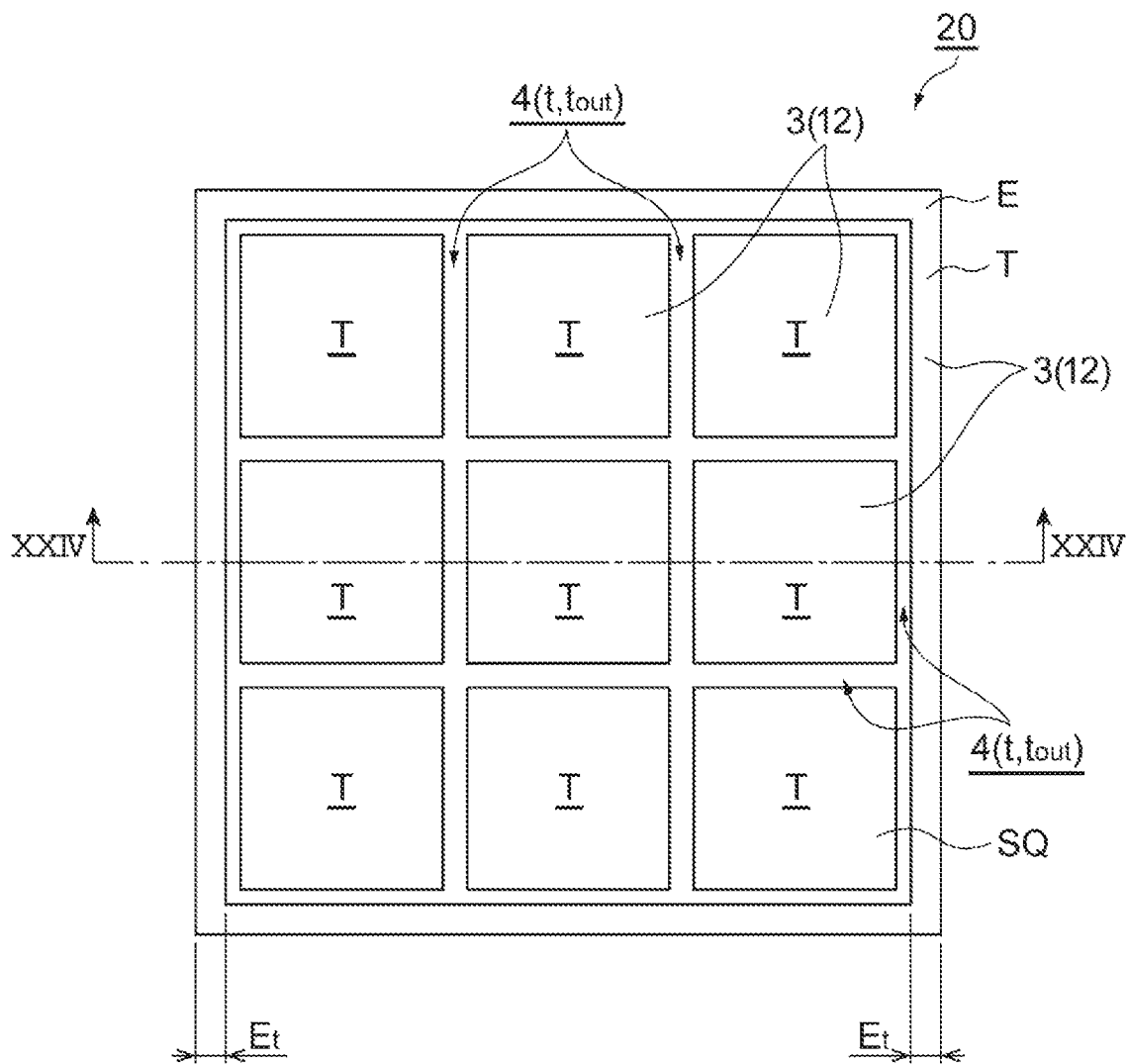
FIG. 20 is a schematic top view of a thin film capacitor formed in an example 7, and in each of comparative examples 2 and 3.
Figure 21:
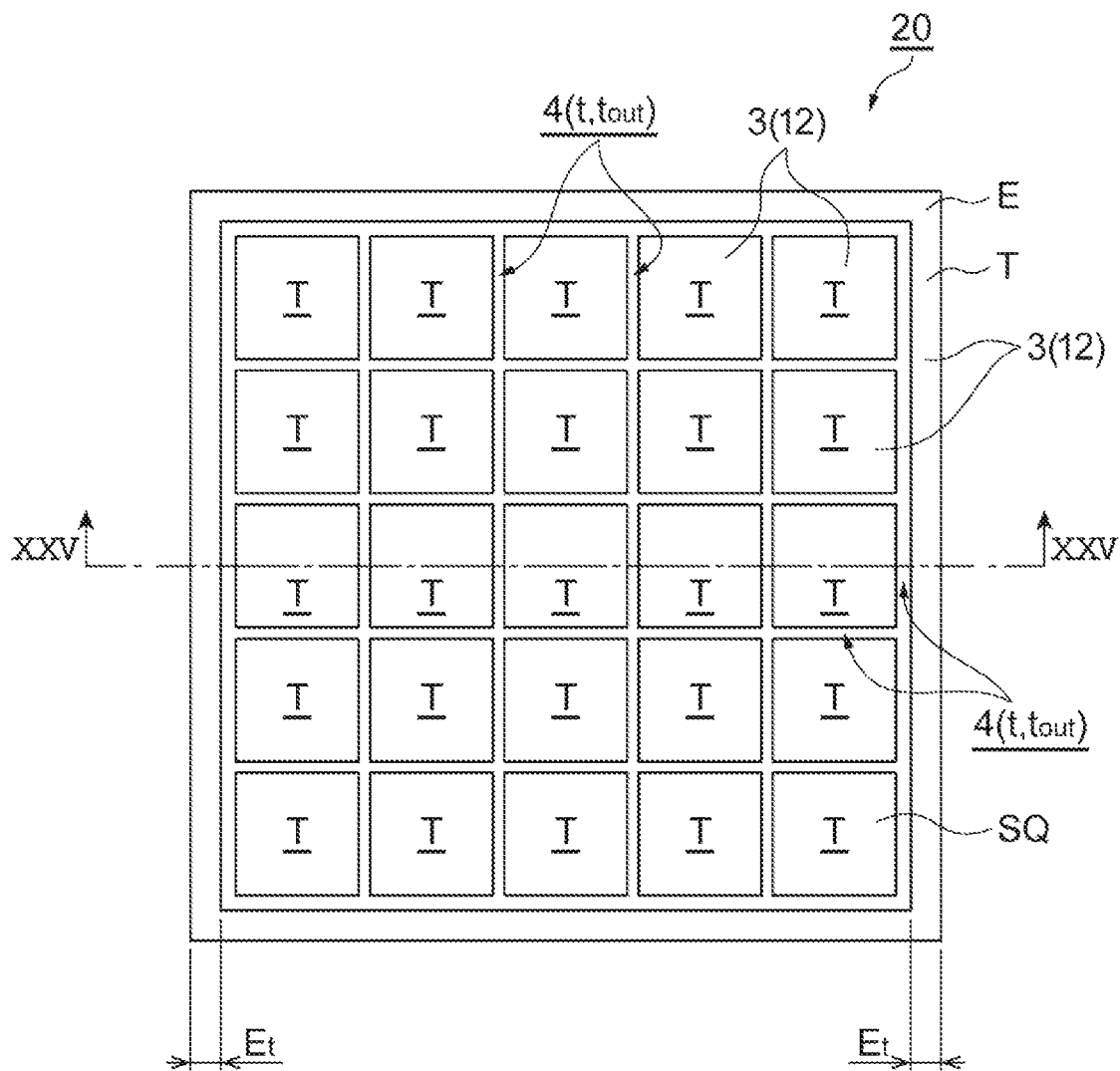
FIG. 21 is a schematic top view of a thin film capacitor formed in each of examples 8 and 9.

An upper electrode layer 3 in each of the examples 1 to 6 and the comparative example 1 was formed in a planar shape as illustrated in FIG. 19, the upper electrode layer 3 in each of the example 7 and the comparative examples 2 to 3 was formed in a planar shape as illustrated in FIG. 20, and the upper electrode layer 3 in each of the examples 8 and 9 was formed in a planar shape as illustrated in FIG. 21. A pattern of each of the upper electrode layers 3 includes an outermost edge portion E in the shape of a square frame, and a plurality of square portions SQ provided in the edge portion E. The edge portion E and the square portions SQ constituted a region T, and a region t existed between the edge portion E and the square portions SQ as well as between the square portions SQ, the region t being a region $t_{out}$.

Figure 22:
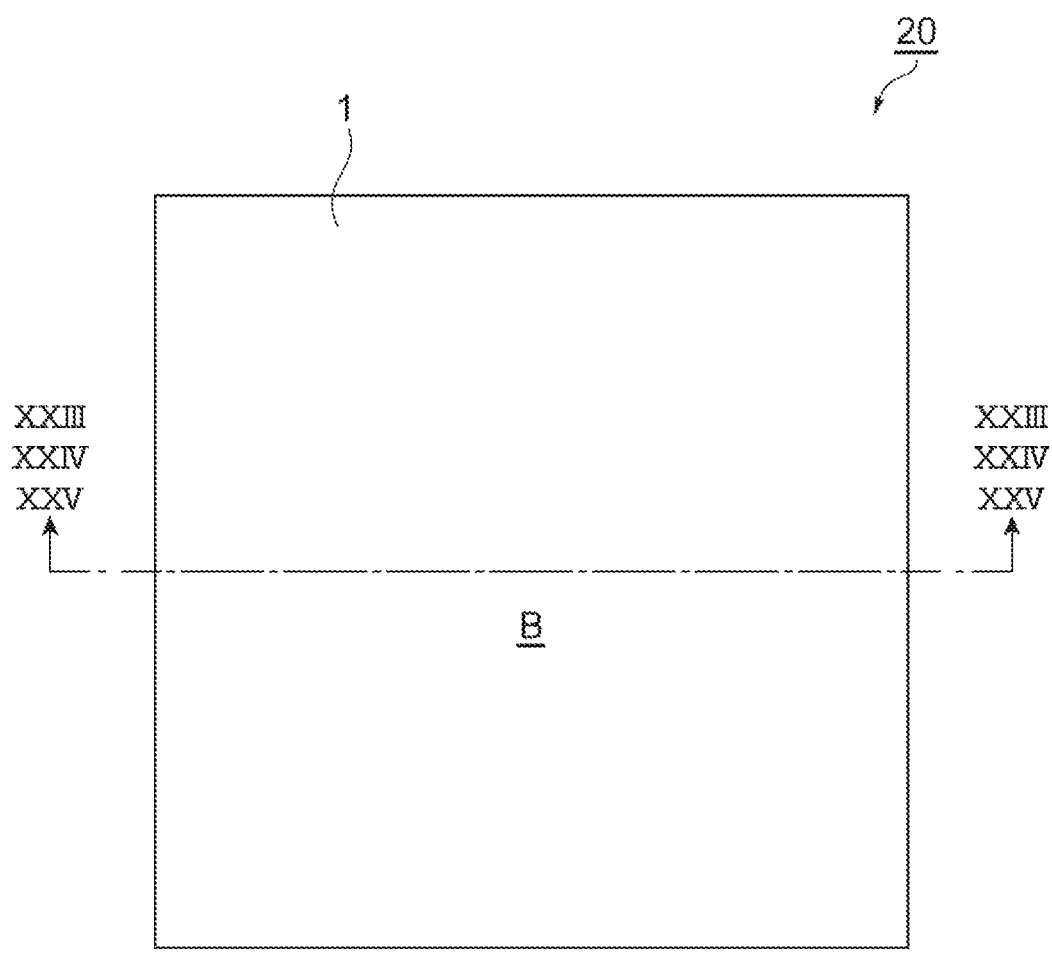
FIG. 22 is a schematic bottom view of a thin film capacitor formed in each of the examples 1 to 9, and in each of the comparative examples 1 and 3.

In the examples 1 to 9 and the comparative examples 1 to 3, a lower electrode layer 1 was formed in a square planar shape as illustrated in FIG. 22.

Figure 23:
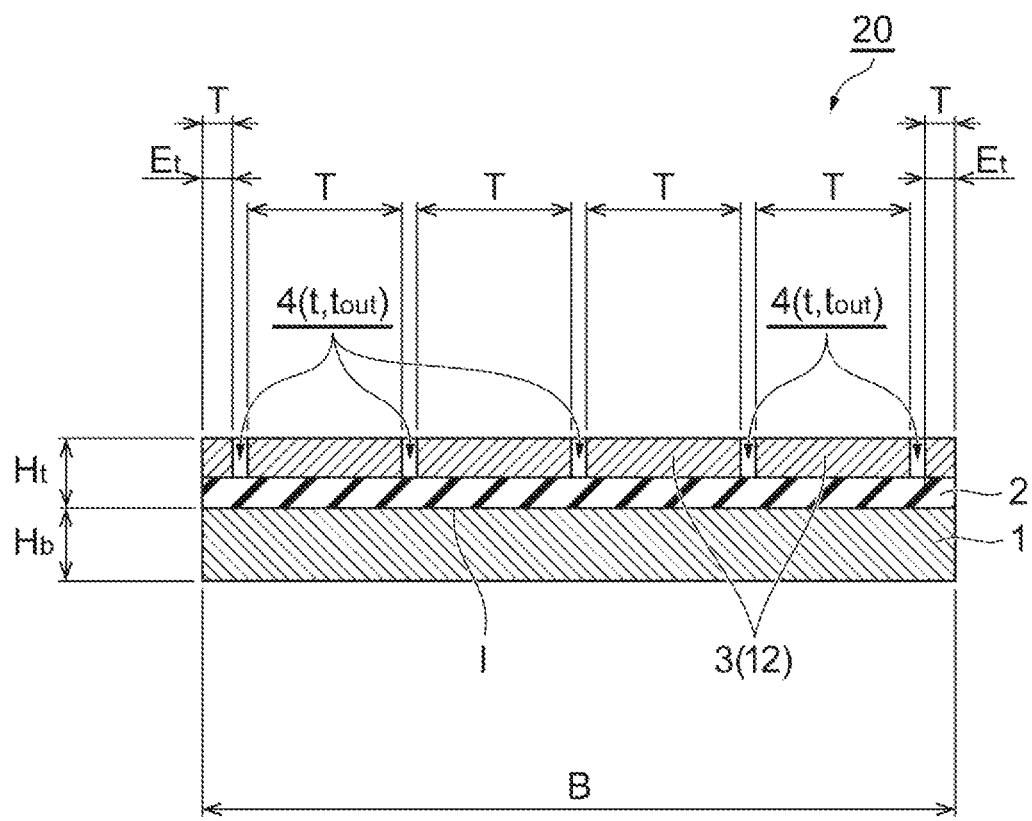
FIG. 23 is a longitudinal sectional view taken along line XXIII-XXIII in each of FIGS. 19 and 22.
Figure 24:
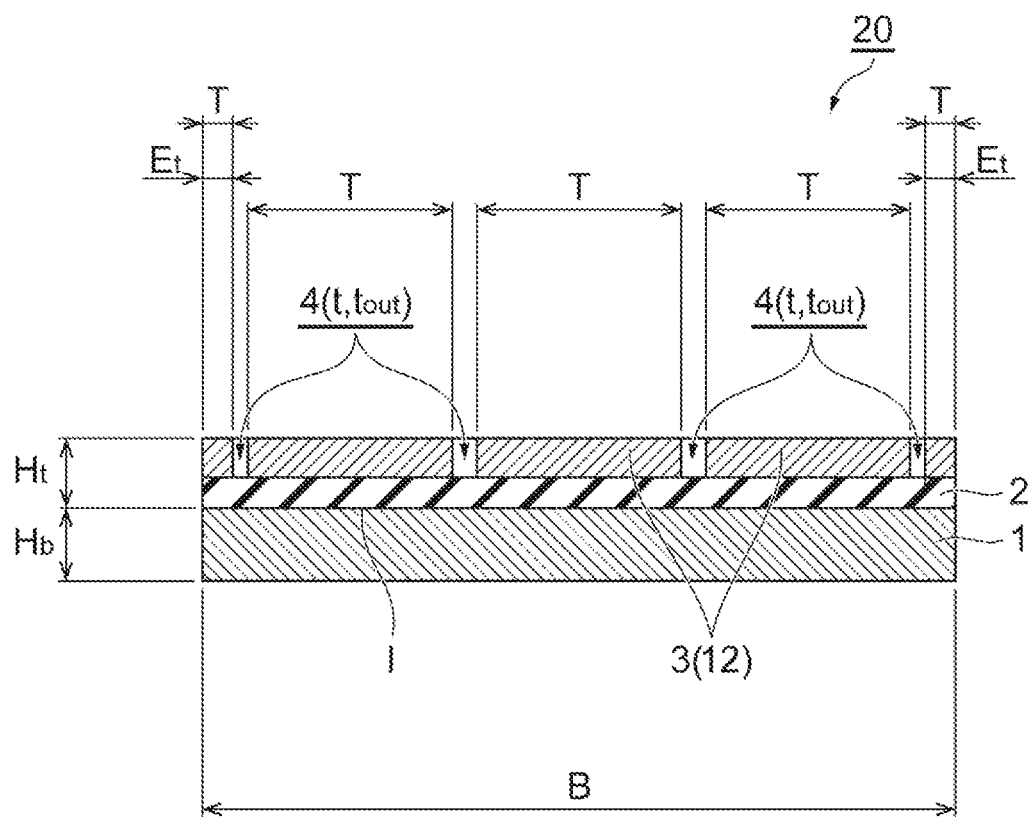
FIG. 24 is a longitudinal sectional view taken along line XXIV-XXIV in each of FIGS. 20 and 22.
Figure 25:
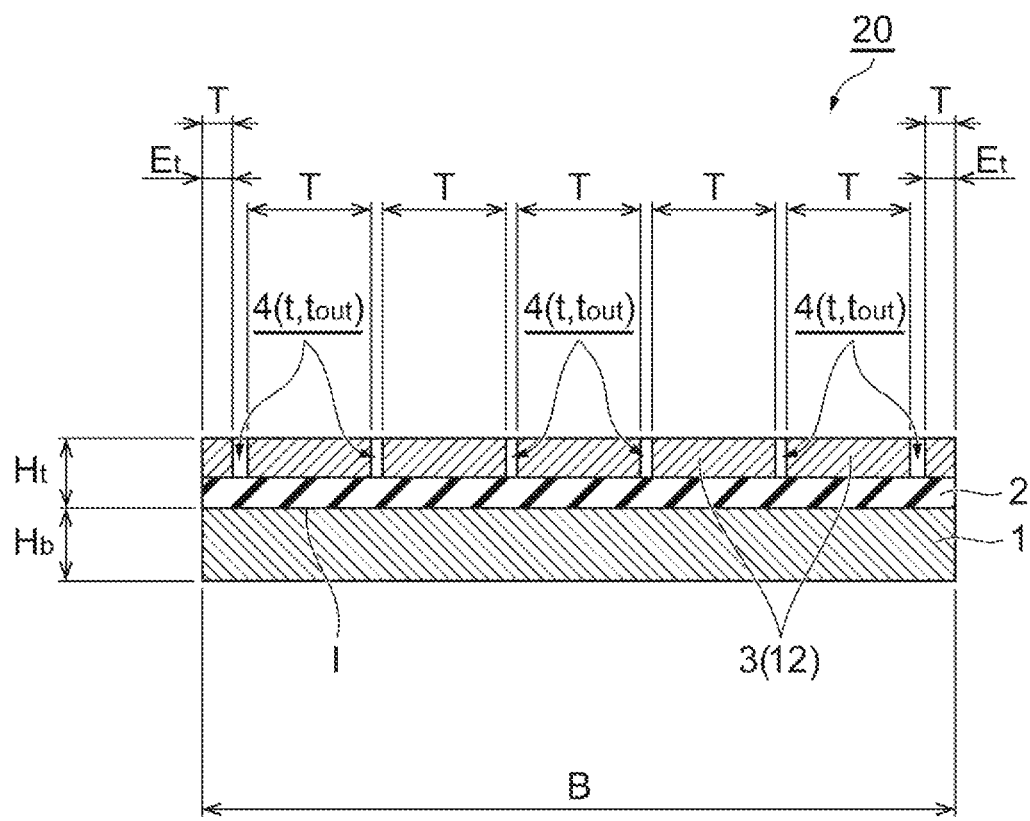
FIG. 25 is a longitudinal sectional view taken along line XXV-XXV in each of FIGS. 21 and 22.

The examples 1 to 6 and the comparative example 1 had a cross section structure as illustrated in FIG. 23, the example 7 and the comparative examples 2 and 3 had a cross section structure as illustrated in FIG. 24, and the examples 8 and 9 had a cross section structure as illustrated in FIG. 25. As described above, a thin film capacitor 20 of each of the examples 1 to 9 and the comparative examples 1 to 3 was formed.

A width $E_t$ of the edge portion E, an area of each of the square portions SQ, the number of the square portions SQ, a distance between the square portions SQ, and a distance between each of the square portions SQ and the edge portion E, of each of the examples and the comparative examples, are shown in Table 1. A projected area S, $S_{Hb}$, $S_{Ht}$, $L_{tout}$, a $S_{Hb}/S$ ratio, a $S_{Ht}/S$ ratio, a value of "$(S_{Ht})^{1/2}/L_{tout}$" and an evaluation result of a humidity load test of the thin film capacitor 20 of each of the examples and the comparative examples are shown together in Table 2. A thermal expansion coefficient $\alpha_d$ of a dielectric layer 2 (BaTiO$_3$ layer) was 15.7 ppm/K, a thermal expansion coefficient of the lower electrode layer 1 (Ni-foil) exposed toward a direction perpendicular to a boundary surface I between the lower electrode layer 1 and the dielectric layer 2 was 12.8 ppm/K, and a thermal expansion coefficient of the upper electrode layer 3 (Cu-layer) exposed toward a direction perpendicular to the boundary surface I between the lower electrode layer 1 and the dielectric layer 2 was 16.8 ppm/K, and thus both of an $\alpha_{Hb}/\alpha_d$ ratio (%) and $\alpha_{Ht}/\alpha_d$ ratio (%) were 50% or less.

reliability by grinding a board of the test board. A defective portion in the thin film capacitor 20 taken out was identified with an IR-Obirch analyzer. Next, the defective portion was processed with a focused ion beam device (FIB), and SEM observation of a section of the defective portion was performed. The defective portion existed immediately below an edge of the upper electrode layer 3, and a crack occurred in the dielectric layer 2 immediately below the edge. If this kind of crack exists during the humidity load test, metal constituting the upper electrode layer 3 tends to spread into the dielectric layer 2 through the crack. As a result, it was

TABLE 1

| | Top view | Bottom view | Sectional view | Width $E_t$ of edge portion E (mm) | Area of square portion SQ (mm$^2$) | The number of square portions SQ (Pieces) | Distance between square portions SQ (mm) | Distance between square portions SQ and edge portion E (mm) |
|---|---|---|---|---|---|---|---|---|
| Example 1 | FIG. 19 | FIG. 22 | FIG. 23 | 5 | 400.0 | 16 | 2.00 | 2.00 |
| Example 2 | FIG. 19 | FIG. 22 | FIG. 23 | 2 | 484.0 | 16 | 1.60 | 1.60 |
| Example 3 | FIG. 19 | FIG. 22 | FIG. 23 | 0 | 622.5 | 16 | 0.04 | 0.04 |
| Example 4 | FIG. 19 | FIG. 22 | FIG. 23 | 0 | 623.8 | 16 | 0.02 | 0.02 |
| Comparative example 1 | FIG. 19 | FIG. 22 | FIG. 23 | 5 | 225.0 | 16 | 6.00 | 6.00 |
| Example 5 | FIG. 19 | FIG. 22 | FIG. 23 | 5 | 324.0 | 16 | 3.60 | 3.60 |
| Example 6 | FIG. 19 | FIG. 22 | FIG. 23 | 5 | 361.0 | 16 | 2.80 | 2.80 |
| Example 7 | FIG. 20 | FIG. 22 | FIG. 24 | 20 | 324.0 | 9 | 1.20 | 1.80 |
| Comparative example 2 | FIG. 20 | FIG. 22 | FIG. 24 | 2 | 324.0 | 9 | 8.40 | 12.60 |
| Comparative example 3 | FIG. 20 | FIG. 22 | FIG. 24 | 10 | 225.0 | 9 | 7.00 | 10.50 |
| Example 8 | FIG. 21 | FIG. 22 | FIG. 25 | 10 | 225.0 | 25 | 1.00 | 0.50 |
| Example 9 | FIG. 21 | FIG. 22 | FIG. 25 | 7 | 225.0 | 25 | 2.20 | 1.10 |

TABLE 2

| | S (mm$^2$) | $S_{Hb}$ (mm$^2$) | $S_{Ht}$ (mm$^2$) | $L_{tout}$ (mm) | $S_{Hb}/S$ ratio (%) | $S_{Ht}/S$ ratio (%) | $(S_{Ht})^{1/2}/L_{tout}$ | Evaluation result of humidity load test |
|---|---|---|---|---|---|---|---|---|
| Example 1 | 10000 | 10000 | 8300 | 2.00 | 100.00 | 83.00 | 45.5 | 100/100 |
| Example 2 | 10000 | 10000 | 8528 | 1.60 | 100.00 | 85.28 | 57.7 | 100/100 |
| Example 3 | 10000 | 10000 | 9960 | 0.04 | 100.00 | 99.60 | 2495.0 | 100/100 |
| Example 4 | 10000 | 10000 | 9981 | 0.02 | 100.00 | 99.81 | 4995.2 | 81/100 |
| Comparative example 1 | 10000 | 10000 | 5500 | 6.00 | 100.00 | 55.00 | 12.4 | 45/100 |
| Example 5 | 10000 | 10000 | 7084 | 3.60 | 100.00 | 70.84 | 23.4 | 100/100 |
| Example 6 | 10000 | 10000 | 7676 | 2.80 | 100.00 | 76.76 | 31.3 | 100/100 |
| Example 7 | 10000 | 10000 | 9316 | 1.80 | 100.00 | 93.16 | 53.6 | 100/100 |
| Comparative example 2 | 10000 | 10000 | 3700 | 12.60 | 100.00 | 37.00 | 4.8 | 32/100 |
| Comparative example 3 | 10000 | 10000 | 5625 | 10.50 | 100.00 | 56.25 | 7.1 | 28/100 |
| Example 8 | 10000 | 10000 | 9225 | 1.00 | 100.00 | 92.25 | 96.0 | 100/100 |
| Example 9 | 10000 | 10000 | 8229 | 2.20 | 100.00 | 82.29 | 41.2 | 100/100 |

From Tables 1 and 2, it was found that excellent humidity load reliability was acquired in the thin film capacitor of each of the examples 1 to 9 in which both of the $S_{Hb}/S$ ratio and the $S_{Ht}/S$ ratio were 60% or more. In addition, in a case where $10 \leq (S_{Ht})^{1/2}/L_{tout} \leq 2500$ was satisfied, it was found that the humidity load reliability increased and a non-defective product rate was 100%.

The thin film capacitor 20 was taken out from a test board that was not a non-defective product in humidity load thought that the upper electrode layer 3 and the lower electrode layer 1 were brought into conduction to cause insulation failure. It was thought that the crack was caused by abnormal stress applied to the dielectric layer 2.

Examples 10 to 15, and Comparative Example 4

Figure 26:
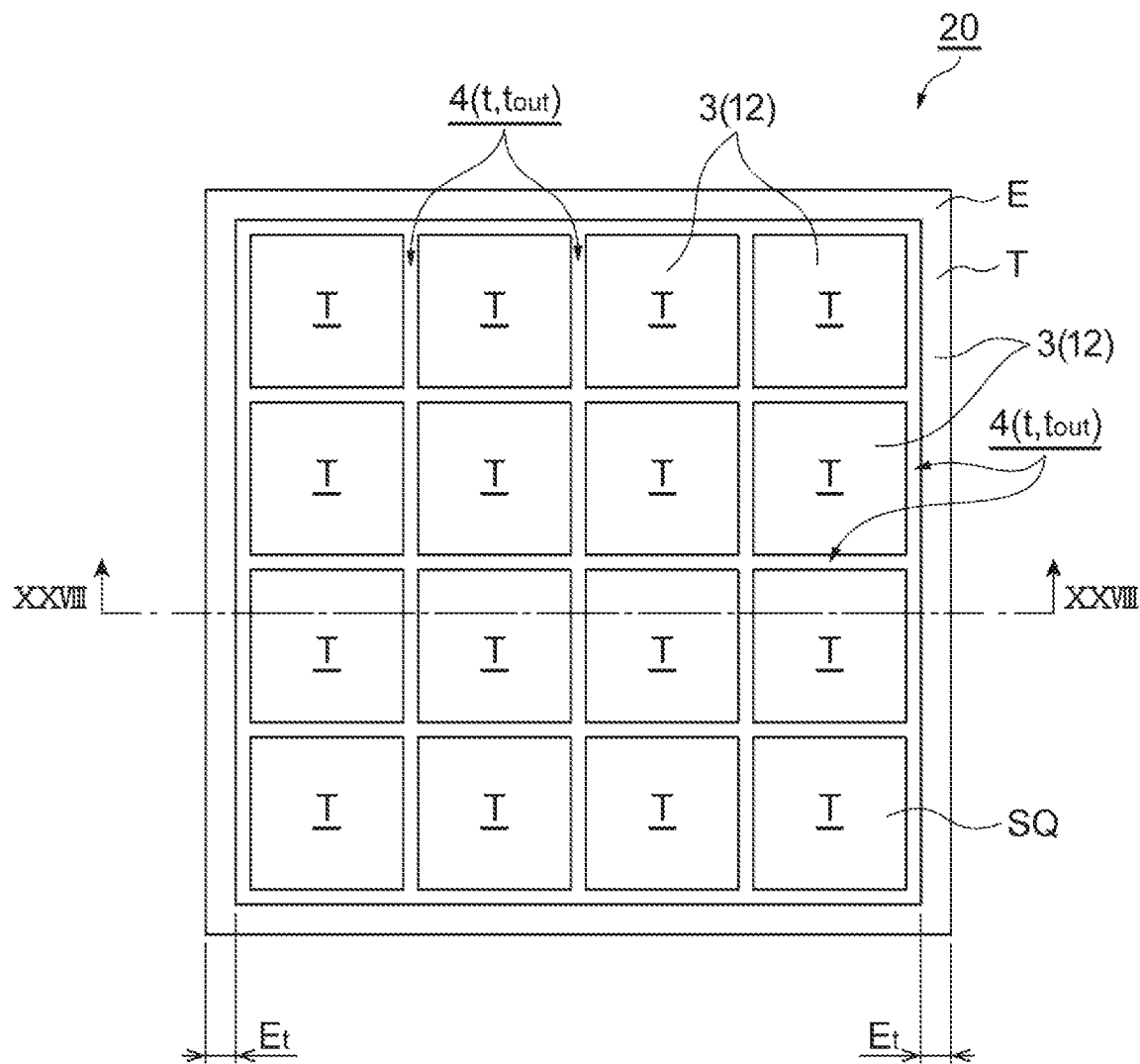
FIG. 26 is a schematic top view of a thin film capacitor formed in each of examples 10 to 15, and in a comparative example 4.
Figure 27:
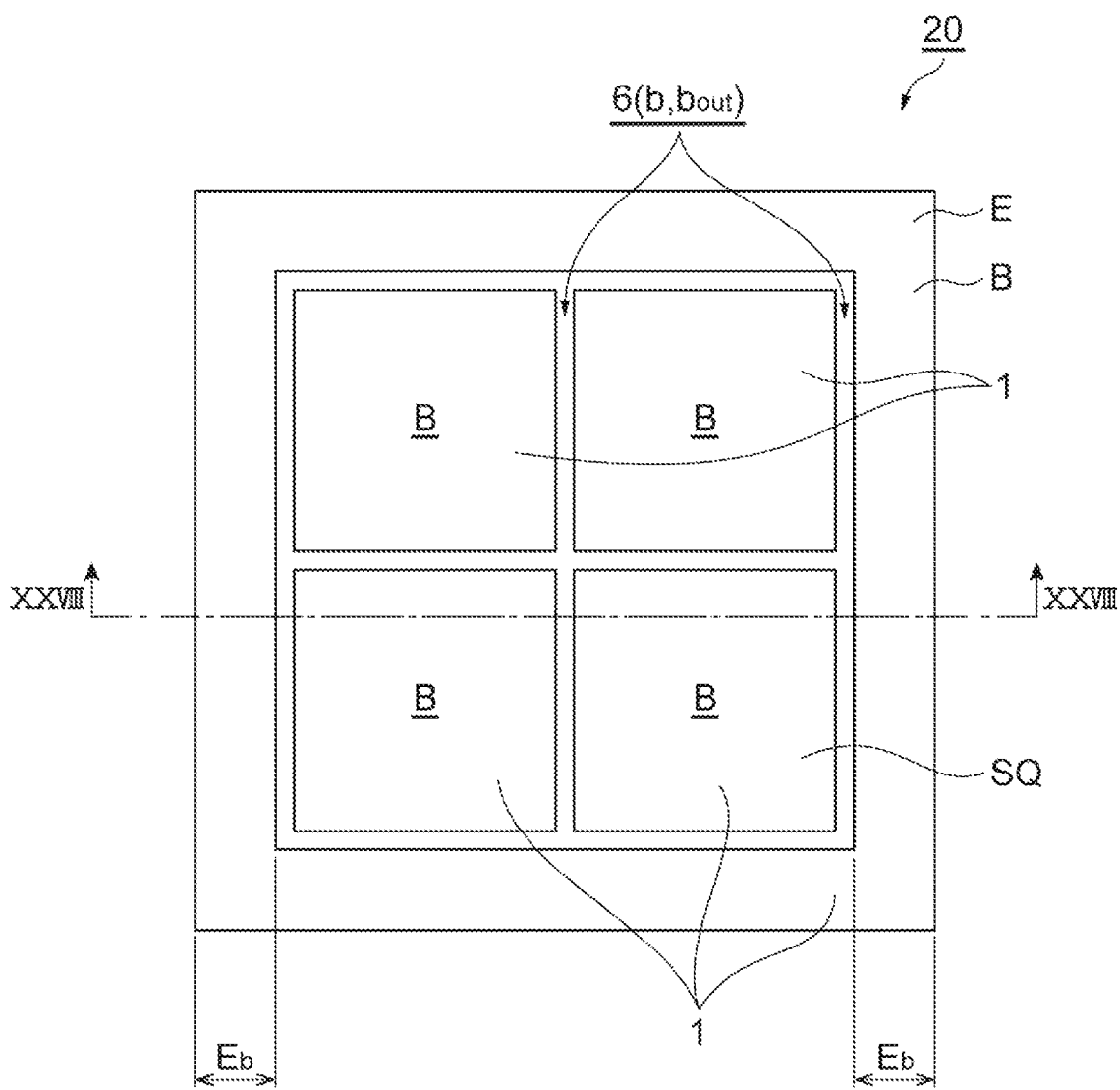
FIG. 27 is a schematic bottom view of the thin film capacitor formed in each of the examples 10 to 15, and in the comparative example 4.
Figure 28:
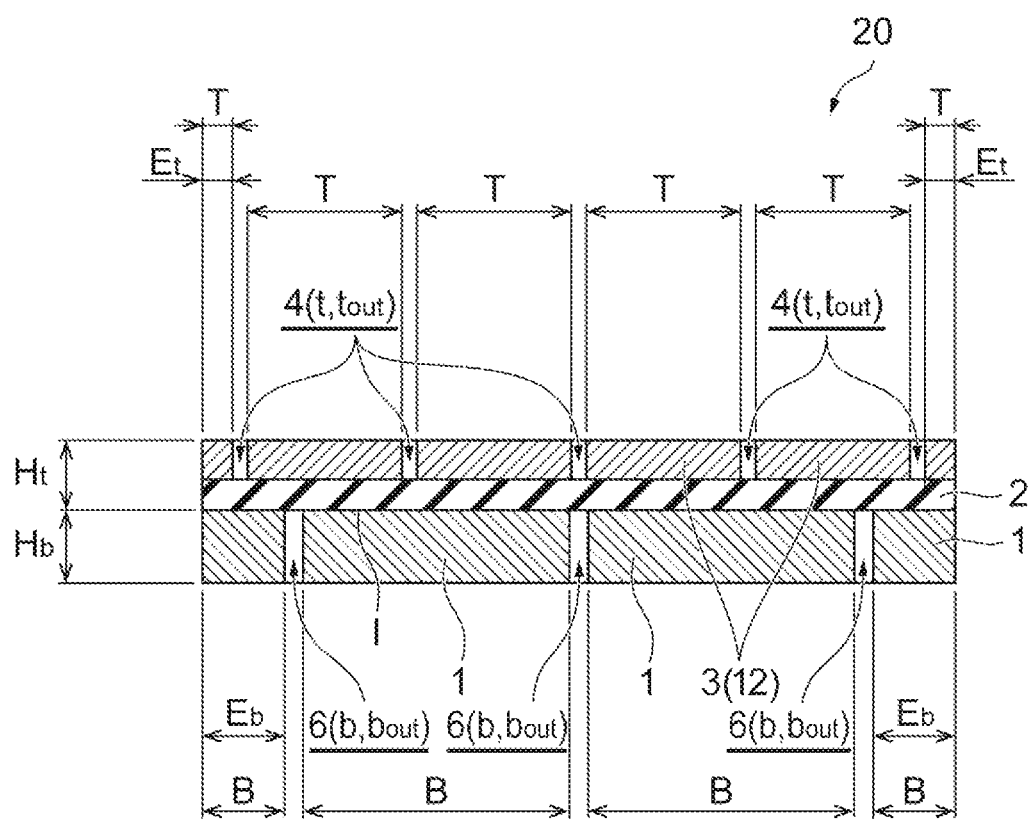
FIG. 28 is a longitudinal sectional view taken along line XXVIII-XXVIII in each of FIGS. 26 and 27.

A thin film capacitor 20 of each of the examples 10 to 15 and the comparative example 4 was formed as with the example 1, except that an upper electrode layer 3 was formed in a planar shape as illustrated in FIG. 26, a lower electrode layer 1 was patterned to be formed in a planar shape as illustrated in FIG. 27, the entire section structure was formed as illustrated in FIG. 28, and dimensions were set as shown in Table 3. FIG. 26 is as with FIG. 19, and the thin film capacitor 20 included an outermost edge portion E in the shape of a square frame, and square portions SQ provided in the edge portion E, as the upper electrode layer 3. However, the thin film capacitor 20 of each of the examples 12 and 13 had no edge portion E as the upper electrode layer 3. In addition, the lower electrode layer 1 included the edge portion E and the square portions SQ, as with the upper electrode layer 3. A pattern of each of the upper electrode layers 3 included the edge portion E and the plurality of square portions SQ provided in the edge portion E. The edge portion E and the square portions SQ constituted a region T or a region B, and a region t or a region b existed between the edge portion E and the square portions SQ as well as between the square portions SQ, the region t and the region b, being a region $t_{out}$ and a region $b_{out}$, respectively.

A width $E_t$ of the edge portion E, an area of each of the square portions SQ, the number of the square portions SQ, a distance between the square portions SQ, a distance between each of the square portions SQ and the edge portion E, S, $S_{Ht}$, and $L_{tout}$ in the upper electrode layer 3 of each of the examples and the comparative examples, are shown in Table 3. A width $E_b$ of the edge portion E, an area of each of the square portions SQ, the number of the square portions SQ, a distance between the square portions SQ, a distance between each of the square portions SQ and the edge portion E, S, $S_{Hb}$, and $L_{bout}$ in the lower electrode layer 1 of each of the examples and the comparative examples, are shown in Table 4. A $S_{Hb}/S$ ratio, a $S_{Ht}/S$ ratio, a value of "$(S_{Hb})^{1/2}/L_{bout}$" a value of "$(S_{Ht})^{1/2}/L_{tout}$" and an evaluation result of a humidity load test of the thin film capacitor 20 of each of the examples and the comparative examples are shown together in Table 5.

TABLE 3

| | Width $E_t$ of edge portion E (mm) | Area of square portion SQ (mm²) | The number of square portions SQ (Pieces) | Distance between square portions SQ (mm) | Distance between square portions SQ and edge portion E (mm) | S (mm²) | $S_{Ht}$ (mm²) | $L_{tout}$ (mm) |
|---|---|---|---|---|---|---|---|---|
| Example 10 | 5 | 400.0 | 16 | 2.00 | 2.00 | 10000 | 8300 | 2.00 |
| Example 11 | 2 | 484.0 | 16 | 1.60 | 1.60 | 10000 | 8528 | 1.60 |
| Example 12 | 0 | 622.5 | 16 | 0.04 | — | 10000 | 9960 | 0.04 |
| Example 13 | 0 | 623.8 | 16 | 0.02 | — | 10000 | 9981 | 0.02 |
| Comparative example 4 | 5 | 225.0 | 16 | 6.00 | 6.00 | 10000 | 5500 | 6.00 |
| Example 14 | 5 | 324.0 | 16 | 3.60 | 3.60 | 10000 | 7084 | 3.60 |
| Example 15 | 5 | 361.0 | 16 | 2.80 | 2.80 | 10000 | 7676 | 2.80 |

TABLE 4

| | Width $E_b$ of edge portion E (mm) | Area of square portion SQ (mm²) | The number of square portions SQ (Pieces) | Distance between square portions SQ (mm) | Distance between square portions SQ and edge portion E (mm) | S (mm²) | $S_{Hb}$ (mm²) | $L_{bout}$ (min) |
|---|---|---|---|---|---|---|---|---|
| Example 10 | 2 | 2025 | 4 | 2.00 | 2.00 | 10000 | 8884 | 2.00 |
| Example 11 | 2 | 2025 | 4 | 2.00 | 2.00 | 10000 | 8884 | 2.00 |
| Example 12 | 2 | 2025 | 4 | 2.00 | 2.00 | 10000 | 8884 | 2.00 |
| Example 13 | 2 | 2025 | 4 | 2.00 | 2.00 | 10000 | 8884 | 2.00 |
| Comparative example 4 | 2 | 2025 | 4 | 2.00 | 2.00 | 10000 | 8884 | 2.00 |
| Example 14 | 2 | 2025 | 4 | 2.00 | 2.00 | 10000 | 8884 | 2.00 |
| Example 15 | 2 | 2025 | 4 | 2.00 | 2.00 | 10000 | 8884 | 2.00 |

TABLE 5

| | $S_{Hb}/S$ ratio (%) | $(S_{Hb})^{1/2}/L_{bout}$ | $S_{Ht}/S$ ratio (%) | $(S_{Ht})^{1/2}/L_{tout}$ | Evaluation result of humidity load test |
|---|---|---|---|---|---|
| Example 10 | 88.84 | 47.1 | 83.00 | 45.6 | 100/100 |
| Example 11 | 88.84 | 47.1 | 85.28 | 57.7 | 100/100 |
| Example 12 | 88.84 | 47.1 | 99.60 | 2495.0 | 100/100 |
| Example 13 | 88.84 | 47.1 | 99.80 | 4995.0 | 80/100 |
| Comparative example 4 | 88.84 | 47.1 | 55.00 | 12.4 | 42/100 |
| Example 14 | 88.84 | 47.1 | 70.84 | 23.4 | 100/100 |
| Example 15 | 88.84 | 47.1 | 76.76 | 31.3 | 100/100 |

From Tables 3 to 5, it was found that excellent humidity load reliability was acquired in the thin film capacitor of each of the examples 10 to 15 in which the $S_{Ht}/S$ ratio was 60% or more. In addition, in a case where $10 \leq (S_{Hb})^{1/2}/L_{bout} \leq 2500$, or $10 \leq (S_{Ht})^{1/2}/L_{tout} \leq 2500$, was satisfied, it was found that the humidity load reliability further increased and a non-defective product rate was 100%.

Examples 16 to 19, and Comparative Examples 5 to 9

A thin film capacitor 20 corresponding to FIGS. 9 to 11 (the third embodiment) was manufactured. For a lower electrode layer 1, Ni-foil of 100 mm×100 mm×30 μm having a polished surface was prepared. A BaTiO₃ layer with a thickness of 800 nm was formed on the Ni-foil by sputtering as a dielectric layer 2. Next, the dielectric layer 2 was crystallized in a reducing atmosphere (an oxygen partial pressure of $10^{-16}$ atm). An Ni-layer with a thickness of 0.5 μm was formed on the dielectric layer 2 by sputtering, and subsequently, a Cu-layer with a thickness of 2 μm was formed by sputtering to form an upper electrode layer 3 composed of the Ni-layer and the Cu-layer, formed by sputtering, on the dielectric layer 2. As illustrated in FIG. 11, the upper electrode layer 3 and the dielectric layer 2 were patterned so that 5000 capacitor elements each with a size of a 1005-type (1 mm by 0.5 mm) element can be formed. An insulation layer (passivation layer) 8 was formed of polyimide resin on the upper electrode layer 3 and the dielectric layer 2 after being patterned, and holes were made in the insulation layer 8. Next, a Ti-layer with a thickness of 20 nm was formed by sputtering, and Cu was formed on the Ti-layer by sputtering to form a seed layer. Cu-plating was applied on the seed layer. As illustrated in FIGS. 9 and 11, the seed layer and the plating layer were patterned to form extracting electrodes 9 and terminal electrode layers 10 for the 5000 1005-type elements. After that, the resulting product was divided into 5000 single 1005-type elements by dicing. As described above, the thin film capacitor 20 of each of the examples 16 to 19 and the comparative examples 5 to 9 was formed.

Terminal electrode dimensions, S (same as $S_{Hb}$), $S_{Ht}$, and a distance (i.e., $L_{tout}$) between terminal electrodes, of each of the examples and the comparative examples, are shown in Table 6. In addition, a $S_{Ht}/S$ ratio, a value of "$(S_{Ht})^{1/2}/L_{tout}$" and an evaluation result of a humidity load test, of each of the examples and the comparative examples, are shown together in Table 7.

TABLE 6

| | Terminal electrode dimension | | S (mm²) | $S_{Ht}$ (mm²) | $L_{tout}$ (mm) |
|---|---|---|---|---|---|
| | Horizontal (mm) | Vertical (mm) | | | |
| Example 16 | 0.422 | 0.398 | 0.50 | 0.336 | 0.040 |
| Example 17 | 0.417 | 0.398 | 0.50 | 0.332 | 0.050 |
| Example 18 | 0.392 | 0.398 | 0.50 | 0.312 | 0.100 |
| Example 19 | 0.382 | 0.398 | 0.50 | 0.304 | 0.120 |
| Comparative example 5 | 0.362 | 0.398 | 0.50 | 0.288 | 0.160 |
| Comparative example 6 | 0.352 | 0.398 | 0.50 | 0.280 | 0.180 |
| Comparative example 7 | 0.342 | 0.398 | 0.50 | 0.272 | 0.200 |
| Comparative example 8 | 0.292 | 0.398 | 0.50 | 0.232 | 0.300 |
| Comparative example 9 | 0.251 | 0.398 | 0.50 | 0.200 | 0.386 |

TABLE 7

| | $S_{Ht}/S$ ratio (%) | $(S_{Ht})^{1/2}/L_{tout}$ | Evaluation result of humidity load test |
|---|---|---|---|
| Example 16 | 67.20 | 14.5 | 100/100 |
| Example 17 | 66.40 | 11.5 | 100/100 |
| Example 18 | 62.40 | 5.6 | 82/100 |
| Example 19 | 60.80 | 4.6 | 86/100 |
| Comparative example 5 | 57.60 | 3.4 | 34/100 |
| Comparative example 6 | 56.00 | 2.9 | 23/100 |
| Comparative example 7 | 54.40 | 2.6 | 21/100 |
| Comparative example 8 | 46.40 | 1.6 | 12/100 |
| Comparative example 9 | 40.00 | 1.2 | 9/100 |

From Tables 6 and 7, it was found that excellent humidity load reliability was acquired in the thin film capacitor of each of the examples 16 to 19 in which the $S_{Ht}/S$ ratio was 60% or more. In addition, in a case where $10 \leq (S_{Ht})^{1/2}/L_{tout} \leq 2500$ was satisfied, it was found that the humidity load reliability further increased and a non-defective product rate was 100%.

Examples 20 to 23

A thin film capacitor corresponding to FIGS. 12 to 14 (the fourth embodiment) was formed. For a lower electrode layer 1, Ni-foil of 100 mm×100 mm×30 μm having a polished surface was prepared. A BaTiO₃ layer with a thickness of 800 nm was formed on the Ni-foil by sputtering as a dielectric layer 2. Next, the dielectric layer 2 was crystallized in a reducing atmosphere (an oxygen partial pressure of $10^{-16}$ atm). A Ni-layer with a thickness of 0.5 μm was formed on the dielectric layer 2 by sputtering, and subsequently, a Cu-layer with a thickness of 2 μm was formed by sputtering to form an upper electrode layer 3 composed of the Ni-layer and the Cu-layer, formed by sputtering, on the dielectric layer 2. As illustrated in FIG. 14, the upper electrode layer 3 and the dielectric layer 2 were patterned so that 5000 capacitor elements each with a size of a 1005 type (1 mm by 0.5 mm) element could be formed. An insulation layer (passivation layer) 8 was formed of polyimide resin on the upper electrode layer 3 and the dielectric layer 2 after being patterned, and holes for the 5000 1005-type elements were made in the insulation layer 8. Next, a Ti-layer with a thickness of 20 nm was formed by sputtering, and Cu was formed on the Ti-layer by sputtering to form a seed layer. Cu-plating was applied on the seed layer. As illustrated in FIGS. 12 and 14, the seed layer and the plating layer were patterned to form extracting electrodes 9 and terminal electrode layers 10 for the 5000 1005-type elements. An additional insulation layer (polyimide resin layer) 11 formed of polyimide resin with a thermal expansion coefficient of 50 ppm/K was formed in a recessed portion between a pair of the terminal electrode layers 10 of each of the 1005 type elements. After that, the resulting product was divided into 5000 single 1005-type elements by dicing. As described above, a thin film capacitor 20 of each of the examples 20 to 23 was formed.

Dimensions and an area of the terminal electrode, dimensions and an area of the polyimide resin layer, a weighted thermal expansion coefficient $\alpha_{Ht}$, and an $\alpha_{Ht}/\alpha_d$ ratio, of each of the examples, are shown in Table 8. In addition, S (same as $S_{Hb}$), $S_{Ht}$, a distance $D_{t-t}$ between the terminal electrodes, a distance $L_{tout}$ between the terminal electrode and the polyimide resin layer, an $S_{Ht}/S$ ratio, a value of "$(S_{Ht})^{1/2}/L_{tout}$" and an evaluation result of a humidity load test, of the thin film capacitor 20 of each of the examples, are shown together in Table 9.

TABLE 8

| | Terminal electrode dimension | | | Polyimide resin layer dimension | | | Weighted thermal expansion coefficient | $\alpha_{Ht}/\alpha_d$ |
|---|---|---|---|---|---|---|---|---|
| | Horizontal (mm) | Vertical (mm) | Area (mm²) | Horizontal (mm) | Vertical (mm) | Area (mm²) | $\alpha_{Ht}$ (ppm/° C.) | ratio (%) |
| Example 20 | 0.251 | 0.398 | 0.200 | 0.286 | 0.398 | 0.114 | 21.6 | 37.5 |
| Example 21 | 0.251 | 0.398 | 0.200 | 0.306 | 0.398 | 0.122 | 21.8 | 38.8 |
| Example 22 | 0.251 | 0.398 | 0.200 | 0.376 | 0.398 | 0.150 | 22.5 | 43.0 |
| Example 23 | 0.211 | 0.398 | 0.168 | 0.456 | 0.398 | 0.181 | 23.7 | 50.7 |

TABLE 9

| | S (mm²) | $S_{Ht}$ (mm²) | Distance $D_{t-t}$ between terminal electrodes (mm) | Distance $L_{tout}$ between terminal electrode and polyimide resin layer (mm) | $S_{Ht}/S$ ratio (%) | $(S_{Ht})^{1/2}/L_{tout}$ | Evaluation result of humidity load test |
|---|---|---|---|---|---|---|---|
| Example 20 | 0.50 | 0.314 | 0.386 | 0.10 | 62.80 | 11.2 | 100/100 |
| Example 21 | 0.50 | 0.322 | 0.386 | 0.08 | 64.40 | 14.2 | 100/100 |
| Example 22 | 0.50 | 0.350 | 0.386 | 0.01 | 70.00 | 118.2 | 100/100 |
| Example 23 | 0.50 | 0.349 | 0.466 | 0.01 | 69.80 | 118.2 | 80/100 |

From Tables 8 and 9, it was found that excellent humidity load reliability was acquired in the thin film capacitor of each of the examples 20 to 23 in which the $S_{Ht}/S$ ratio was 60% or more. Since the polyimide resin layer had a thermal expansion coefficient of 30 ppm/K, the weighted thermal expansion coefficient $\alpha_{Ht}$ increased as the polyimide region increased in area. As a result, the humidity load reliability slightly deteriorated.

REFERENCE SIGNS LIST

1 . . . lower electrode layer (first electrode layer), 2 . . . dielectric layer, 3 . . . upper electrode layer (second electrode layer), 4, 6 . . . groove, 5, 7 . . . through-hole, 20 . . . thin film capacitor, 22 . . . board, 30 . . . capacitor device.

What is claimed is:
1. A thin film capacitor comprising:
a first electrode layer;
an outer layer including a second electrode layer; and
a dielectric layer provided between the first electrode layer and the second electrode layer in a stacking direction,
wherein the first electrode layer has one or more regions B in which a distance in the stacking direction between a boundary surface of the first electrode layer and the dielectric layer, and a surface of the first electrode layer, is maximum,
the outer layer has a plurality of regions T in which a distance in the stacking direction between the boundary surface and a surface of the outer layer is maximum, as well as one or more regions t in which the distance in the stacking direction between the boundary surface and the surface of the outer layer is not maximum,
the surface of the outer layer is exposed outside in the stacking direction,
the outer layer includes the second electrode layer, an insulation layer covering the second electrode layer and the dielectric layer, terminal electrode layers provided on the insulation layer, and extracting electrodes connecting the terminal electrode layer to the first electrode layer or the second electrode layer electrically, and
in a case where a projected area of all of the regions B projected on a plane parallel to the boundary surface is designated as $S_{Hb}$, a projected area of all of the regions T projected on a plane parallel to the boundary surface is designated as $S_{Ht}$, a projected area of the first electrode layer, the outer layer, and the dielectric layer, projected on a plane parallel to the boundary surface is designated as S, each of regions in the one or more regions t, existing between the regions T, is designated as a region $t_{out}$, and a maximum value in maximum widths of the respective regions $t_{out}$ is designated as $L_{out}$, each of regions in the one or more regions $t$, existing in the regions T, is designated as a region $t_{in}$, and a maximum value in maximum diameters of the respective regions $t_{in}$ is designated as $L_{tin}$, the $S_{Hb}$ and the S satisfy an equation (1) below, the $S_{Ht}$ and the S satisfy an equation (2) below, the $S_{Ht}$ and the $L_{tout}$ satisfy an equation (3) below, and the $S_{Ht}$ and the $L_{tin}$ satisfy an equation (4) below:

$$60\% \leq (S_{Hb}/S) \quad (1)$$

$$60\% \leq (S_{Ht}/S) \quad (2)$$

$$10 \leq (S_{Ht})^{1/2}/L_{tout} \leq 2500 \quad (3)$$

$$10 \leq (S_{Ht})^{1/2}/L_{tin} \leq 2500 \quad (4).$$

2. The thin film capacitor according to claim 1, wherein the first electrode layer is a metal foil.

3. The thin film capacitor according to claim 1, wherein in a case where a thermal expansion coefficient of a material constituting a plane exposed toward a direction perpendicular to the boundary surface, in the one or more regions B, is designated as $\alpha_{Hb}$, a thermal expansion coefficient of a material constituting a plane exposed toward a direction perpendicular to the boundary surface, in the one or more regions T, is designated as $\alpha_{Ht}$, and a thermal expansion coefficient of the dielectric layer is designated as $\alpha_d$, the $\alpha_{Hb}$ and the $\alpha_d$ satisfy an equation (7) below, and $\alpha_{Ht}$ and the $\alpha_d$ satisfy an equation (8) below:

$$(|\alpha_d - \alpha_{Hb}|/\alpha_d) \leq 50\% \quad (7)$$

$$(|\alpha_d - \alpha_{Ht}|/\alpha_d) \leq 50\% \quad (8).$$

4. A thin film capacitor comprising:
a first electrode layer;
an outer layer including a second electrode layer; and
a dielectric layer provided between the first electrode layer and the second electrode layer in a stacking direction,
wherein the first electrode layer has a plurality of regions B in which a distance in the stacking direction between a boundary surface of the first electrode layer and the dielectric layer, and a surface of the first electrode layer, is maximum,
the outer layer has one or more regions T in which a distance in the stacking direction between the boundary surface and a surface of the outer layer is maximum, as well as one or more regions t in which the distance in the stacking direction between the boundary surface and the surface of the outer layer is not maximum,
the surface of the outer layer is exposed outside in the stacking direction,
the outer layer includes the second electrode layer, an insulation layer covering the second electrode layer and the dielectric layer, terminal electrode layers provided on the insulation layer, and extracting electrodes connecting the terminal electrode layer to the first electrode layer or the second electrode layer electrically,
the first electrode layer further has one or more regions b in which a distance between the boundary surface and the surface of the first electrode layer is not maximum, and
in a case where a projected area of all of the regions B projected on a plane parallel to the boundary surface is designated as $S_{Hb}$, a projected area of all of the regions T projected on a plane parallel to the boundary surface us designated as $S_{Ht}$, and a projected area of the first electrode layer, the outer layer, and the dielectric layer, projected on a plane parallel to the boundary surface is designated as S, and each of regions in the one or more regions b, existing between the regions B, is designated as a region $b_{out}$, and a maximum value in maximum widths of the respective regions $b_{out}$ is designated as $L_{bout}$, the $S_{Hb}$ and the S satisfy an equation (1) below, the $S_{Ht}$ and the S satisfy an equation (2), and the $S_{Hb}$ and the $L_{bout}$ satisfy an equation (5) below:

$$60\% \leq (S_{Hb}/S) \quad (1)$$

$$60\% \leq (S_{Ht}/S) \quad (2)$$

$$10 \leq (S_{Hb})^{1/2}/L_{bout} \leq 2500 \quad (5).$$

5. The thin film capacitor according to claim 4, wherein the first electrode layer is a metal foil.

6. The thin film capacitor according to claim 4, wherein in a case where a thermal expansion coefficient of a material constituting a plane exposed toward a direction perpendicular to the boundary surface, in the one or more regions B, is designated as $\alpha_{Hb}$, a thermal expansion coefficient of a material constituting a plane exposed toward a direction perpendicular to the boundary surface, in the one or more regions T, is designated as $\alpha_{Ht}$, and a thermal expansion coefficient of the dielectric layer is designated as $\alpha_d$, the $\alpha_{Hb}$ and the $\alpha_d$ satisfy an equation (7) below, and $\alpha_{Ht}$ and the $\alpha_d$ satisfy an equation (8) below:

$$(|\alpha_d - \alpha_{Hb}|/\alpha_d) \leq 50\% \quad (7)$$

$$(|\alpha_d - \alpha_{Ht}|/\alpha_d) \leq 50\% \quad (8).$$

7. A thin film capacitor comprising:
a first electrode layer;
an outer layer including a second electrode layer; and
a dielectric layer provided between the first electrode layer and the second electrode layer in a stacking direction,
wherein the first electrode layer has one or more regions B in which a distance in the stacking direction between a boundary surface of the first electrode layer and the dielectric layer, and a surface of the first electrode layer, is maximum,
the outer layer has one or more regions T in which a distance in the stacking direction between the boundary surface and a surface of the outer layer is maximum, as well as one or more regions t in which the distance in the stacking direction between the boundary surface and the surface of the outer layer is not maximum,
the surface of the outer layer is exposed outside in the stacking direction,
the outer layer includes the second electrode layer, an insulation layer covering the second electrode layer and the dielectric layer, terminal electrode layers provided on the insulation layer, and extracting electrodes connecting the terminal electrode layer to the first electrode layer or the second electrode layer electrically,
the first electrode layer further has one or more regions b in which a distance between the boundary surface and the surface of the first electrode layer is not maximum,
in a case where a projected area of all the regions B projected on a plane parallel to the boundary surface is designated as $S_{Hb}$, a projected area of all of the regions T projected on a plane parallel to the boundary surface is designated as $S_{Ht}$, and a projected area of the first electrode layer, the outer layer, and the dielectric layer, projected on a plane parallel to the boundary surface designated as S, and each of regions in the one or more regions b, existing in the regions B, is designated as a region $b_{in}$, and a maximum value in maximum diameters of the respective regions $b_{in}$ is designated as $L_{bin}$, the $S_{Hb}$ and the S satisfy an equation (1) below, the $S_{Ht}$ and the S satisfy an equation (2), and the $S_{Hb}$ and the $L_{bin}$ satisfy an equation (6) below:

$$60\% \leq (S_{Hb}/S) \tag{1}$$

$$60\% \leq (S_{Ht}/S) \tag{2}$$

$$10 \leq (S_{Hb})^{1/2}/L_{bin} \leq 2500 \tag{6}$$

8. The thin film capacitor according to claim 7, wherein the first electrode layer is a metal foil.

9. The thin film capacitor according to claim 7, wherein in a case where a thermal expansion coefficient of a material constituting a plane exposed toward a direction perpendicular to the boundary surface, in the one or more regions B, is designated as $\alpha_{Hb}$, a thermal expansion coefficient of a material constituting a plane exposed toward a direction perpendicular to the boundary surface, in the one or more regions T, is designated as $\alpha_{Ht}$, and a thermal expansion coefficient of the dielectric layer is designated as $\alpha_d$, the $\alpha_{Hb}$ and the $\alpha_d$ satisfy an equation (7) below, and $\alpha_{Ht}$ and the $\alpha_d$ satisfy an equation (8) below:

$$(|\alpha_d - \alpha_{Hb}|/\alpha_d) \leq 50\% \tag{7};$$

$$(|\alpha_d - \alpha_{Ht}|/\alpha_d) \leq 50\% \tag{8}.$$

* * * * *